(12) United States Patent
Honecker et al.

(10) Patent No.: US 8,197,885 B2
(45) Date of Patent: Jun. 12, 2012

(54) METHODS FOR PRODUCING SODIUM/MOLYBDENUM POWER COMPACTS

(75) Inventors: Dave Honecker, Sahuarita, AZ (US); Christopher Michaluk, Sahuarita, AZ (US); Carl Cox, Sahuarita, AZ (US); James Cole, Ft. Madison, IA (US)

(73) Assignee: Climax Engineered Materials, LLC, Phoenix, AZ (US)

( * ) Notice: Subject to any disclaimer, the term of this patent is extended or adjusted under 35 U.S.C. 154(b) by 560 days.

(21) Appl. No.: 12/392,792

(22) Filed: Feb. 25, 2009

(65) Prior Publication Data
US 2009/0188789 A1  Jul. 30, 2009

Related U.S. Application Data

(63) Continuation-in-part of application No. 12/013,263, filed on Jan. 11, 2008.

(51) Int. Cl.
*B05D 5/12* (2006.01)
*B29C 67/00* (2006.01)
*B32B 3/00* (2006.01)
*B22F 9/00* (2006.01)

(52) U.S. Cl. ......... 427/74; 427/76; 204/298.13; 419/10; 419/31; 419/38; 419/39; 419/48; 419/49; 419/62; 419/68; 420/429; 75/230; 75/245; 75/388; 75/228; 75/231; 75/255; 75/351; 264/122; 264/125; 264/604; 264/642; 264/667; 264/656; 264/660; 264/666; 136/243; 136/206; 136/263; 136/264; 136/265; 136/251; 136/252

(58) Field of Classification Search .................. None
See application file for complete search history.

(56) References Cited

U.S. PATENT DOCUMENTS

| 2,898,978 | A |   | 8/1959  | Kitchen et al. |
|-----------|---|---|---------|----------------|
| 3,071,463 | A |   | 1/1963  | Hausner et al. |
| 3,110,590 | A | * | 11/1963 | Little, Jr. ............ 75/231 |
| 3,455,682 | A | * | 7/1969  | Barbaras ............ 419/18 |
| 3,481,714 | A |   | 12/1969 | Harrington et al. |
| 3,592,395 | A |   | 7/1971  | Lockwood, Jr. |

(Continued)

FOREIGN PATENT DOCUMENTS

EP      1348669      1/2003

(Continued)

OTHER PUBLICATIONS

Notification of Transmittal of the International Search Report and the Written Opinion of the International Searching Authority, or the Declaration, International Search Report, and Written Opinion of the International Searching Authority, PCT/US2009/30561, mailed Mar. 10, 2009, 9 pages.

(Continued)

*Primary Examiner* — Jeffrey Wollschlager
(74) *Attorney, Agent, or Firm* — Fennemore Craig, P.C.

(57) ABSTRACT

A method for producing a metal article according to one embodiment may include: Providing a supply of a sodium/molybdenum composite metal powder; compacting the sodium/molybdenum composite metal powder under sufficient pressure to form a preformed article; placing the preformed article in a sealed container; raising the temperature of the sealed container to a temperature that is lower than a sintering temperature of molybdenum; and subjecting the sealed container to an isostatic pressure for a time sufficient to increase the density of the article to at least about 90% of theoretical density.

23 Claims, 7 Drawing Sheets

U.S. PATENT DOCUMENTS

| | | | |
|---|---|---|---|
| 3,617,358 A | 11/1971 | Dittrich | |
| 3,865,586 A | 2/1975 | Volin et al. | |
| 3,907,546 A | 9/1975 | Port et al. | |
| 3,909,241 A | 9/1975 | Cheney et al. | |
| 3,973,948 A | 8/1976 | Laferty, Jr. et al. | |
| 3,974,245 A | 8/1976 | Cheney et al. | |
| 4,028,095 A | 6/1977 | Laferty, Jr. et al. | |
| 4,146,388 A | 3/1979 | Lafferty et al. | |
| 4,221,614 A | 9/1980 | Yoda et al. | |
| 4,376,055 A | 3/1983 | Korosec et al. | |
| 4,502,885 A | 3/1985 | Cheney | |
| 4,592,781 A | 6/1986 | Cheney et al. | |
| 4,613,371 A | 9/1986 | Cheney et al. | |
| 4,622,068 A | 11/1986 | Rowe et al. | |
| 4,670,047 A | 6/1987 | Kopatz et al. | |
| 4,687,510 A | 8/1987 | Cheney et al. | |
| 4,708,159 A | 11/1987 | Lockwood, Jr. | |
| 4,714,468 A | 12/1987 | Wang et al. | |
| 4,716,019 A | 12/1987 | Houck et al. | |
| 4,767,313 A | 8/1988 | Lockwood, Jr. | |
| 4,770,948 A | 9/1988 | Oikawa et al. | |
| 4,778,516 A | 10/1988 | Raman | |
| 4,787,934 A | 11/1988 | Johnson et al. | |
| 4,802,915 A | 2/1989 | Kopatz et al. | |
| 4,819,873 A | 4/1989 | Lockwood, Jr. | |
| 4,838,784 A | 6/1989 | Lockwood, Jr. | |
| 4,891,080 A * | 1/1990 | Del Corso et al. | 148/326 |
| 4,938,798 A * | 7/1990 | Chiba et al. | 75/230 |
| 4,941,820 A | 7/1990 | Lockwood, Jr. | |
| 4,952,353 A | 8/1990 | Neil | |
| 4,976,778 A | 12/1990 | Berry et al. | |
| 4,976,779 A | 12/1990 | Webwer et al. | |
| 4,992,039 A | 2/1991 | Lockwood, Jr. | |
| 4,992,043 A | 2/1991 | Lockwood, Jr. | |
| 5,037,705 A | 8/1991 | Weber et al. | |
| 5,063,021 A | 11/1991 | Anand et al. | |
| 5,082,710 A | 1/1992 | Wright | |
| 5,124,091 A | 6/1992 | Paliwal et al. | |
| 5,173,108 A | 12/1992 | Houck | |
| 5,197,399 A | 3/1993 | Mansour | |
| 5,252,061 A | 10/1993 | Ozer et al. | |
| 5,255,634 A | 10/1993 | Mansour | |
| 5,328,500 A | 7/1994 | Beltz et al. | |
| 5,330,557 A | 7/1994 | May | |
| 5,346,678 A | 9/1994 | Phillips et al. | |
| 5,482,530 A | 1/1996 | Hohne | |
| 5,523,048 A | 6/1996 | Stinson et al. | |
| 5,626,688 A | 5/1997 | Probst et al. | |
| 5,641,580 A | 6/1997 | Sampath et al. | |
| 5,658,142 A | 8/1997 | Kitchen et al. | |
| 5,842,289 A | 12/1998 | Chandran et al. | |
| 5,994,163 A * | 11/1999 | Bodegård et al. | 438/84 |
| 6,022,395 A | 2/2000 | Eckert et al. | |
| 6,102,979 A | 8/2000 | Bianco et al. | |
| 6,114,048 A | 9/2000 | Jech et al. | |
| 6,376,103 B1 | 4/2002 | Sampath et al. | |
| 6,470,597 B1 | 10/2002 | Stipp | |
| 6,512,208 B1 * | 1/2003 | Bergman | 219/400 |
| 6,548,197 B1 | 4/2003 | Chandran et al. | |
| 6,551,377 B1 | 4/2003 | Leonhardt | |
| 6,593,213 B2 | 7/2003 | Stanbery | |
| 6,733,562 B2 | 5/2004 | Knunz et al. | |
| 7,041,200 B2 * | 5/2006 | Le et al. | 204/192.12 |
| 7,250,076 B2 | 7/2007 | Maze et al. | |
| 7,300,492 B2 | 11/2007 | Singh et al. | |
| 7,311,874 B2 * | 12/2007 | Zhang | 419/32 |
| 7,470,307 B2 | 12/2008 | Larink, Jr. | |
| 7,837,929 B2 * | 11/2010 | Gaydos et al. | 419/42 |
| 2002/0134198 A1 | 9/2002 | Edlinger | |
| 2002/0150528 A1 | 10/2002 | Maus et al. | |
| 2004/0128016 A1 * | 7/2004 | Stewart | 700/159 |
| 2004/0216558 A1 | 11/2004 | Mariani | |
| 2005/0254987 A1 | 11/2005 | Azzi et al. | |
| 2006/0051288 A1 | 3/2006 | Tsurumi et al. | |
| 2006/0204395 A1 | 9/2006 | Johnson | |
| 2007/0089984 A1 * | 4/2007 | Gaydos et al. | 204/298.12 |
| 2007/0295390 A1 | 12/2007 | Sheats et al. | |
| 2008/0057203 A1 | 3/2008 | Robinson et al. | |
| 2008/0314737 A1 * | 12/2008 | Gaydos et al. | 204/192.15 |

FOREIGN PATENT DOCUMENTS

| | | |
|---|---|---|
| GB | 777591 | 6/1957 |
| GB | 1347581 | 2/1974 |
| GB | 2006264 A | 5/1979 |
| JP | 02034701 A | 2/1990 |
| JP | 5311212 A | 11/1993 |
| SU | 1444077 A1 | 12/1988 |
| WO | 0067936 A1 | 11/2000 |
| WO | 2010032802 A1 | 3/2010 |
| WO | 20100032803 A1 | 3/2010 |

OTHER PUBLICATIONS

Unknown, "Successful Tests: Materials Sucessfully Dried in PCS Dryers as of Jun. 2001, 161 Materials," Web Page, Downloaded Mar. 28, 2005, http://www.pulsedry.com/materials.html.

Examiner's Report for Great Britain Patent Application No. 0718170.4 dated Jan. 13, 2010, 3 pages.

Office Action filed by the United States Patent and Trademark Office for U.S. Appl. No. 12/169,794 on Mar. 22, 2010, 12 pages.

Office Action filed by the United States Patent and Trademark Office for U.S. Appl. No. 12/169,916, on May 12, 2010, 10 pages.

International Search Report, International Preliminary Report on Patentability, and Written Opinion for the Internatinoal Searching Authority for PCT/US06/010883, dated Nov. 16, 2007, 12 pages.

International Search Report dated Jun. 24, 2009 for PCT Application No. PCT/US 09/43992, 4 pages.

Written Opinion of the International Searching Authority dated Jun. 24, 2009, for PCT Application PCT/US 09/43992, 5 pages.

Low dimensional electronic properties and charge density waves in molybdenum bronzes 203rd American Chemical Society national meeting. 1992, pp. 1190, Paper INOR 618, 2442—Schlenker, C.

Lifetime studies of high power rhodium/tungsten and molybdenum electrodes for application to AMTEC (alkali metal thermal-to-electric converter) Proceedings of the 25th intersociety energy conversion engineering conference., vol. 2. 1990, pp. 413-419, 499.

Recent advanced in alkali metal thermoelectric converter (AMTEC) electrode performance and modeling. Bankston, C. P.; Proceedings of the SPIE—The International Society for Optical Engineering vol. 871, 1988, pp. 64-69.

Pulsed Electrodeposition of Ni-Mo Alloys. Nee, C. C.; vol. 135, No. 5, 1988, pp. 1100-1103, Journal of the Electrochemical Society.

Effect of preliminary plastic deformation on the anodic behavior of molybdenum-rhenium alloys. Amirkhanova, N. A.; vol. 23, No. 6, 1988, pp. 739-741, Protection of Metals.

Effects of NaSUB2MoOSUB4 and NaSUB2WOSUB4 on molybdenum and tungsten electrodes for the alkali metal thermoelectric converter (AMTEC). Williams, R. M.; vol. 135, No. 11, 1988, pp. 2736-2742.

Effect of preliminary plastic deformation on the anodic behavior of molybdenum -rhenium alloys. Prot. Met. (Engl. Transl.), vol. 23, No. 6 Jul. 1988, pp. 739-741, Amirkhanova, N. A. Tatarinova, 0. M.

Corrosion of some metals in sulfur-polysulfide melts. Corros. Sci. No. 10, 1988 pp. 953-967, Dobson, J. C. McLarnon, F. R., Cairns, E. J.

Electrochemical studies of the corrosion of molybdenum electrodes in soda-lime glass melts. Balazs, G. B.; Ruessel, C., vol. 105, No. 1, 1988, pp. 1-6.

Development of High Purity Molybdenum Sputtering Target for VLSI Metallisation. Oikawa, H; Amazawa, T; Honma, N; Miyazaki, H; Mori, N, Bull. Jpn. Inst. Met., vol. 26, No. 5, 1987, 419-421.

Field-Assisted Reaction at Molybdenum—Molten Silicate Glass Interface—Effects of Additives Such as Fe sub 2 0 sub 3 , NiO, Cr sub 2 0 sub 3 and MnO sub 2, Miura, Y; Takahashi, K; Asada, M, Journal of the Society of Materials Science, Japan, vol. 35, No. 389, Feb. 1986, 126-132.

Nondestructive Determination of Light Element Concentrations in Mo Powder Alloys Using Deuterons. Mukhammedov, S; Rakhmonov, A A, Zavodskaya Laboratoriya. Diagnostika Materialov, No. 4, 1986, 14-15.

Composition and proposed structure of the alkali metal layered molybdenum bronzes. Mater. Res. Bull., vol. 21, No. 8, Aug. 1986, pp. 945-960, Thomas, D. M., Mc Canon, E. M. III.

Protection of porous molybdenum from corrosion in distilled water with inhibiting additions of surfactants. Zashch. Met., vol. 21, No. 1 Jan.-Feb. 1985, pp. 9-14, Tomashov, N. D., Chukalovskaya, T. V., Deryagina, 0. G., Medova, I. L.

On possibility of determination of interaction potential from experiment on slow ions elastic scattering. Izv. Akad. Nauk SSSR, Ser. Fiz. vol. 49, No. 9, Sep. 1985, pp. 1821-1824, Gruich, D. D., Tukhtaev, M. A.

Cathodic processes of platinum electrodes during Na sub 2 MoO sub 3 -MoO sub 3 melt electrolysis. Soy. Electrochem. (Engl. Transl.) vol. 21, No. 3, Sep. 1985, pp. 367-370, Institute of Electrochemistry, Ural Scientific Center, Academy of Sciences of the USSR, Sverdlovsk, Komarov, V. E.

Quasi-two-dimensional electronic properties of the sodium molybdenum bronze, Na /SUB 0.9/ Mo sub 6 0 sub 1 sub 7. J. Solid State Chem., vol. 59, No. 2, Sep. 1985, pp. 149-154, Department of Chemistry, Rutgers—The State University, New Brunswick, New Jersey, Location of Work—US, Greenblatt, M., Neifeld, R.

Gil-Su Kim et al., "Consolidation behavior of Mo powder fabricated from milled Mo oxide by hydrogen-reduction," Journal of Alloys and Compounds 454 (2008) 321-330.

Roca—Drilling Intersects New Molybdenum Zone at MAX and Drilling Commences at Foremore VMS—Gold Project. Aug. 12, 2008, Roca Mines Inc; Teck Cominco Ltd.

Electrodeposition o chromium-molybdenum alloy from electrolyte based on chromium(III) sulfate. Kuznetsov, V.V.; Matveev, D.V., Russ J electrochem, vol. 44, No. 6, Jun. 2008, pp. 740-744, 8.

Methodology for life testing of refractory metal/ sodium heat pipes. Martin, James J; Reid, Robert S, Star, Aug. 15, 2006, vol. 44, No. 16, Aug. 15, 2006, ISSN-1548-8837, NASA Marshall Space Flight Center, Huntsville, AL, USA.

Mo oxide modified catalysts for direct methanol, formaldehyde and formic acid fuel cells. Song, C.; Khanfar, M.; Pickup, P. G., Journal of Applied Electrochemistry, (Netherlands), vol. 36, No. 3, Mar. 2006, pp. 339-345.

Corrosion resistance of molybdenum silicides in aqueous solutions. Casales, M.; Gonzalez-Rodriguez, J.G.; Martinez, L.; Rosales, I. J. Solid State Electrochem. vol. 9, No. 10, Oct. 2005, pp. 691-697.

Corrosion of Si3N4-MoSi2 ceramic composite in acid- and basic-aqueous environments: surface modification and properties degradation. Winterhalter, F; Medri, V; Ruffini, A; Bellosi, A, Applied Surface Science, vol. 225 No. 1-4, Mar. 30, 2004, 100-115.

Corrosion properties of $MoSi_2$-$Si_3N_4$ nanocomposite in acidic and basic aqueous environments. Desai, Vimal; Du, Tianbao; Mohan, Prabhakar; Suryanarayana, C., Meet. Abstr., 2004, pp. 724, 3.

Polarisation behaviour and corrosion initiation mechanisms of Mo coated with amorphous hydrogenated silicon alloy thin ceramic films. Hihara, L.H.; Iwane, A.S.; Rocheleau, R.E., Corros. Eng. Sci. Technol., vol. 39, No. 4, Dec. 2004, pp. 277-286.

Correlation between Diffusion Parameters and the Temperature-Dependent Modulus of Elasticity of Metals. Shevchuk, Y A, Inorganic Materials (Russia) vol. 40, No. 4, Apr. 2004 368-371.

Electrodeposition of Al-Mo alloys from the Lewis acidic aluminum chloride-1-ethyl-3- methylimidazolium chloride molten salt. Hussey, Charles L.; Stafford, Gery R.; Tsuda, Tetsuya, J Electrochem Soc, vol. 151 No. 6, 2004, pp. C379-C384.

Calorimetric study of hydrated sodium molybdenum bronze. Suzuki, Takashi, Hatta, Bungo, Chin, Kin, Eda, Kazuo, Sotani, Noriyuki, Thermochimica Acta; 406; Issue: 1.

Effect of $Na_2O$ on mechanical properties of $MoSi_2$/oxide composites for heating elements. Jiang, Wan; Wang, Gang; Zhao, Shi-Ke Wuji Cailiao Xuebao, vol. 18, No. 1, Jan. 2003 pp. 103-108.

Obtainingsup 99 Mo -sup 99m Tc gel—generator based on zirconium molybdate. Dragolici, Felicia; Enescu, Sanda-Elena; Oancea, Margareta; Preda, Mihaela; Prodan, Lucia; Raduta, Adriana; Sandu, Doina; Schiaua, Claudiu (eds.)Horia Hulubei National Institute for Physics and Nuclear Engineering, 156 pages. Jul. 1, 2001, 115 pages.

Photometric determination of high contents of silicon in aluminium alloys by the small alpha -silicon-molybdenum heteropoly acid method. Zou, K.; Shi, A. Q. Lihua Jianyan, Huaxue Fence, vol. 37 No. 11, Nov. 2001, pp. 525, 527.

Pitting behavior of Al-3103 implanted with molybdenum. Zhang, X.; Lo Russo, S.; Zandolin, S.; Miotello, A.; Cattaruzza, E.; Bonora, P.L.; Benedetti, L., vol. 43, No. 1, 2001, pp. 85-97.

Investigation of mechanism of common electroreduction of dimolybdate, ditungstate ions and dioxide carbon on background of tungstate sodium melt. Kushkhov, K B; Beroeva, L M, Rasplavy, vol. 6. Nov. 2001, 26-33 pages.

Investigation of molybdenum –44.5%rhenium as cell wall material in an AMTEC based space power system. AIP Conference Proceedings; Conference: STAIF-2000: Space technology and applications international forum, Albuquerque, NM (United States), Jan. 30-Feb. 3, 2000.

Single-crystal growth of a new sodium molybdenum bronze. NaSUB0SUB.SUB8SUB6MoSUB5OSUB1SUB4 Yoshikawa, A.; Yagisawa, K.; Shimoda, M.; Terasaki, F.; Takano, N.; Naito, N. vol. 16, No. 8, 1997, pp. 619-620, Journal of Materials Science Letters.

Preparation of hydrated potassium molybdenum bronzes and their thermal decomposition. Journal of Solid State Chemistry, vol. 132 No. 2, Sep. 1997, pp. 330-336, Sotani, Noriyuki Suzuki, Takashi, Kobe Univ. , Japan, and others.

Preventing the accelerated low-temperature oxidation of MoSi/sub 2/ (pesting) by the application of superficial alkali-salt layers. Cockeram, B. V.; Wang, G.; Rapp, R. A., Oxidation of Metals vol. 45, No. 1-2, Feb. 1996 pp. 77-108.

Sodium ion sensitive electrode based on a molybdenum oxide bronze. Shuk, P.; Greenblatt, M.; Ramanujachary, K.V. vol. 91, No. 3, 1996, pp. 233-238, Solid State Ionics.

High temperature corrosion behavior of commercial high temperature alloys under deposits of alkali salts Conference proceedings of the international conference on heat-resistant materials, Natesan, K., Ganesan, P., Lai, G. Y., 1995 pp. 245-252.

Performance of a Silicon-Modified Aluminide Coating in High Temperature Hot Corrosion Test Conditions. Kircher, T A McMordie, B G; McCarter, A, Surf. Coat. Technol. (Switzerland), vol. 68/69, Publication Date—Dec. 1, 1994 pp. 32-37, Document.

Cupric ion promotion of corrosion inhibition of molybdenum alloys by benzotriazole. Kendig, M; Jeanjaquet, S; Cunningham, M; Rosenberg, R, Oct. 10, 1994, pp. 167-178, Conference Paper, Rockwell International Science Center.

Effect of TeO sub 2 on the high temperature corrosion of Inconel 601. Huntz, A M; Moulin, G; Severac, C; Haut, C, Cah. Inf. Tech. Rev. Metall. vol. 91., No. 5, May 1994, pp. 799-814.

Pitting and crevice corrosion of iron aluminides in a mild acid-chloride solution. Corrosion vol. 50, No. 9, Sep. 1994, pp. 658-668, Univ. of Tennessee, Knoxville, TN (United States). Dept. of Materials Science and Engineering, Kim, J. G., Buchanan, R. A.

Electrode, current collector, and electrolyte studies for AMTEC cells. AIP Conference Proceedings vol. 271, No. 2, Jan. 15, 1993, pp. 905-912.

Evaluation of the kinetic parameters of the sodium insertion in sodium molybdates by impedance spectroscopy. Journal of the Electrochemical Society (United States), vol. 139, No. 9 Sep. 1992, pp. 2359-2362.

K. Ramanathan et al., Properties of 19-2% Efficiency ZnO/CdS/CuInGaSe2 Thin-film Solar Cells, Progress in Photovoltaics: Research and Applications, 2003, 6 pages, 11:225-230, John Wiley & Sons, Ltd.

John H. Scofield et al., Sodium Diffusion, Selenization, and Microstructural Effects Associated with Various Molybdenum Back Contact Layers for CIS-Based Solar Cells, Proc. of the 24th IEEE Photovoltaic Specialists Conference (IEEE, New York, 1995), pp. 164-167.

Jae Ho Yun et al., Fabrication of CIGS solar cells with a Na-doped Mo layer on a Na-free substrate, ScienceDirect, Thin Solid Films 515 (2007) pp. 5876-5879.

K. Ramanathan et al., Properties of High-Efficiency CIGS Thin-film Solar Cells, NREL/CP-520-37404, Feb. 2005, Golden Colorado, 7 pages.

Behaviour of amalgams of some d-metals during cathodic polarization in solutions. Elektrokhimiya, vol. 18, No. 2, Feb. 1982, pp. 204-209, Speranskaya, E. F. Sagadieva, K. Kh., Usik, V. I., Kazakhskij Gosudarstvennyj Univ., Alma.

Electrodeposition of Molybdenum and Molybdenum—Tungsten Alloys From Tungstate Molybdate Melts. Tarasova, K P; Baraboshkin, A N; Martem'yanova, Z S; Bichin, V P, Zashch. Met. vol. 17, No. 3, Mar. 1981 pp. 371-374.

Coprecipitation of Rhenium and Molybdenum With Tin Disulfide. Koval, L B; Chaus, I S; Sheka I A, Ukr. Khim. Zh. vol. 46 No. 5, Sep. 1980 917-921.

Contribution to the x-ray fluorescent analysis of ferroalloys employing the sample fusing technique. Hutnik (Katowice), vol. 47 No. 10 1980, pp. 389-395, Jurczyk, J., Instytut Metalurgii Zelaza, Gliwice , Poland, Wyszomirski.

Structure, Work Function, and Thermal Stability of Sodium Films on a (112) Face of Molybdenum. Gupalo, M. S.; Medvedev, V. K.;. Palyukh, B. M.; Smereka, T. P. vol. 22, No. 11, Nov. 1980 pp. 1873-1876.

Endako: Canada'S Largest Molybdenum Producer. Anon, vol. 97, No. 8, Aug. 1976, pp. 14.

Studying VM-1 molybdenum alloy workability at high current density. II Elektron. Obrab. Mater., No. 6, 1976, pp. 82-84, Tatarinova, 0. M., Amirkhanova, N. A., Zaripov, R. A.

Kinetics of galvanodiffusive calorizing of molybdenum from a chloride salt melt. Prot. Met. (USSR) (Engl. Transl.), vol. 11, No. 1, 1975, pp. vp, Andreev, Yu. A. Fokin, M. N. Batenina, 0. I., Ryabikov, N. A.

Electrodeposition of Molybdenum Coatings. McCawley FX; Wyche C; Schlain D vol. 116, No. 7, Jul. 1969 pp. 1028-1033, Electrochem Soc-J.

Diffusion of alkali metals in molybdenum and niobium (Diffusion of potassium and sodium in crystalline aggregates of molybdenum and niobium). Benediktova, G P; Dubinin, G N; Karpman, M G; Shcherbedinskii, G V Metallovedenie I, Termicheskaia Obrabotka Metallov Edition—Mar. 1967, Mar. 1967 46-49.

Electrode, current collector, and electrolyte studies for AMTEC cells. Cambridge Scientific, Ryan, Margaret A.; Williams, Roger M.; Underwood, Mark L.; Jeffries-Nakamura, Barbara ; O'Connor, Dennis, (JPL, Pasadena, CA), 8 pages, In: Space nuclear power and propulsion; Proceedings of the 10th Symposium, Albuquerque, NM, Jan. 10-14, 1993. Pt. 2 (A94-32883 11-20), New York, American Institute of Physics, 1993, p. 905-912.

Study of electrodeposition of molybdenum-tin alloys Molecular Structure of the Solid-Liquid Interface and Its Relationship to Electrodeposition 5. Moron, L.E.; Torres, J., ECS Transactions, vol. 3, No. 17, 2007.

Fabrication of high-temperature /1400-1700 K/ molybdenum heat pipes. Lundberg, L. B.; Martinez, H. E., Energy to the 21st century; Proceedings of the Fifteenth Intersociety Energy Conversion Engineering Conference, Seattle, Wash., Aug. 18-22, 1980. vol. 1. (A80-48165 21-44) New York, American Institute of Aeronautics and Astronautics, Inc., 1980, p. 753-761.

Extraction of Molybdenum and Rhenium From Concentrates by Electrooxidation. Lindstrom, R. E.; Scheiner, B. J.

Reduction of Sodium Ion Density in Mo Gate MOS Devices by Ta Addition to Gate Electrodes. Ohfuji, Shin-ichi; Shiono, Noboru, vol. 84, 1984, pp. 679-680.

Stabilization of Mo-Gate MOS Structures Using HSUB2 Doping in Mo and High Temperature Forming Gas Annealing. Ohfuji, Shinichi; Shiono, Noboru, vol. 131, No. 7, 1984, pp. 1688-1692.

Dielectronic recombination rates for ions of the sodium sequence. LaGattuta, K. J.; Hahn, Y., Physical Review A (General Physics), vol. 30, No. 1, Jul. 1984 pp. 316-324.

* cited by examiner

SCREEN FRACTION OF GREEN SPRAY DRY - MO-SoMo CO-SPRAYED

METHODS FOR PRODUCING SODIUM/MOLYBDENUM POWER COMPACTS

CROSS-REFERENCE TO RELATED APPLICATION

This is a continuation-in-part of co-pending U.S. patent application Ser. No. 12/013,263, filed on Jan. 11, 2008, which is hereby incorporated herein by reference for all that it discloses.

TECHNICAL FIELD

This invention relates metal powder compositions in general and more specifically to sodium/molybdenum powder compacts and methods for making sodium/molybdenum powder compacts.

BACKGROUND

Molybdenum coatings are well-known in the art and may be applied by a variety of processes in a wide variety of applications. One application for molybdenum coatings is in the production of photovoltaic cells. More specifically, one type of high-efficiency polycrystalline thin film photovoltaic cell involves an absorber layer comprising $CuInGaSe_2$. Such photovoltaic cells are commonly referred to as "CIGS" photovoltaic cells after the elements comprising the absorber layer. In a common construction, the $CuInGaSe_2$ absorber layer is formed or "grown" on a soda-lime glass substrate having a molybdenum film deposited thereon. Interestingly, it has been discovered that small quantities of sodium from the soda-lime glass substrate diffusing through the molybdenum film serve to increase the efficiency of the cell. See, for example, K. Ramanathan et al., Photovolt. Res. Appl. 11 (2003), 225; John H. Scofield et al., Proc. of the $24^{th}$ IEEE Photovoltaic Specialists Conference, IEEE, New York, 1995, 164-167. While such efficiency gains are automatically realized in structures wherein the CIGS cell is deposited on soda-lime glass substrates, it has proven considerably more difficult to realize efficiency gains where other types of substrates are used. Furthermore, it is expected that the efficiency of CIGS cells can be further increased by increasing the concentration of sodium in the CIGS absorber layer to levels greater than those attained from the diffusion of sodium from soda lime glass.

There is considerable interest in forming CIGS cells on flexible substrates so that the cells may be made lighter and may be readily conformed to a variety of shapes. While such cells have been made and are being used, the flexible substrates involved do not contain sodium. Consequently, the performance of CIGS cells manufactured on such substrates may be improved by doping the molybdenum layer with sodium. See, for example, Jae Ho Yun et al., Thin Solid Films, 515, 2007, 5876-5879.

SUMMARY OF THE INVENTION

A method for producing a metal article according to one embodiment may include: Providing a supply of a sodium/molybdenum composite metal powder; compacting the sodium/molybdenum composite metal powder under sufficient pressure to form a preformed article; placing the preformed article in a sealed container; raising the temperature of the sealed container to a temperature that is lower than a sintering temperature of molybdenum; and subjecting the sealed container to an isostatic pressure for a time sufficient to increase the density of the article to at least about 90% of theoretical density. Also disclosed is a metal article produced in accordance with this process.

Another method for producing a metal article may include: Providing a supply of a sodium/molybdenum composite metal powder; compacting the sodium/molybdenum composite metal powder under sufficient pressure to form a preformed article; placing the preformed article in a sealed container; raising the temperature of the sealed container to a temperature that is lower than the melting point of sodium molybdate; and subjecting the sealed container to an isostatic pressure for a time sufficient to increase the density of the article to at least about 97% of theoretical density.

BRIEF DESCRIPTION OF THE DRAWINGS

Illustrative and presently preferred exemplary embodiments of the invention are shown in the drawings in which:

FIG. 7 is a plot showing the screen fraction distributions of exemplary composite metal powders produced in accordance with the teachings provided herein;

DETAILED DESCRIPTION OF THE PREFERRED EMBODIMENTS

Figure 1:
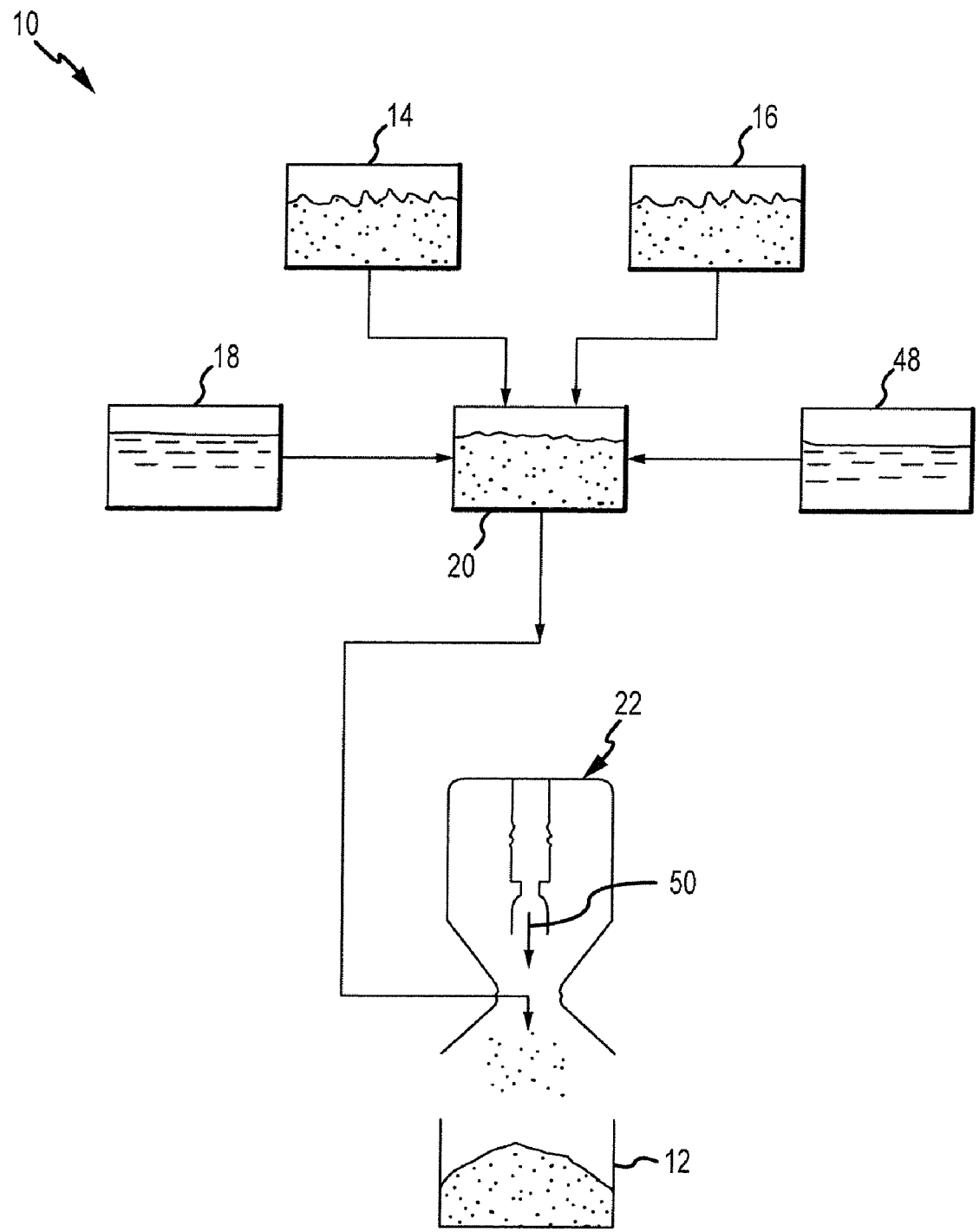
FIG. 1 is a schematic representation of one embodiment of basic process steps which may be utilized to produce a sodium/molybdenum composite metal powder.

A process or method 10 for producing a sodium/molybdenum composite metal powder 12 is illustrated in FIG. 1 and, briefly described, may comprise a supply of a molybdenum metal powder 14 and a supply of a sodium compound 16, such as, for example, sodium molybdate ($Na_2MoO_4$) powder. The molybdenum metal powder 14 and sodium molybdate powder 16 are combined with a liquid 18, such as water, to form a slurry 20. The slurry 20 may then be spray dried, e.g., by a pulse combustion spray dryer 22, in order to produce the sodium/molybdenum composite metal powder 12.

Figure 2:
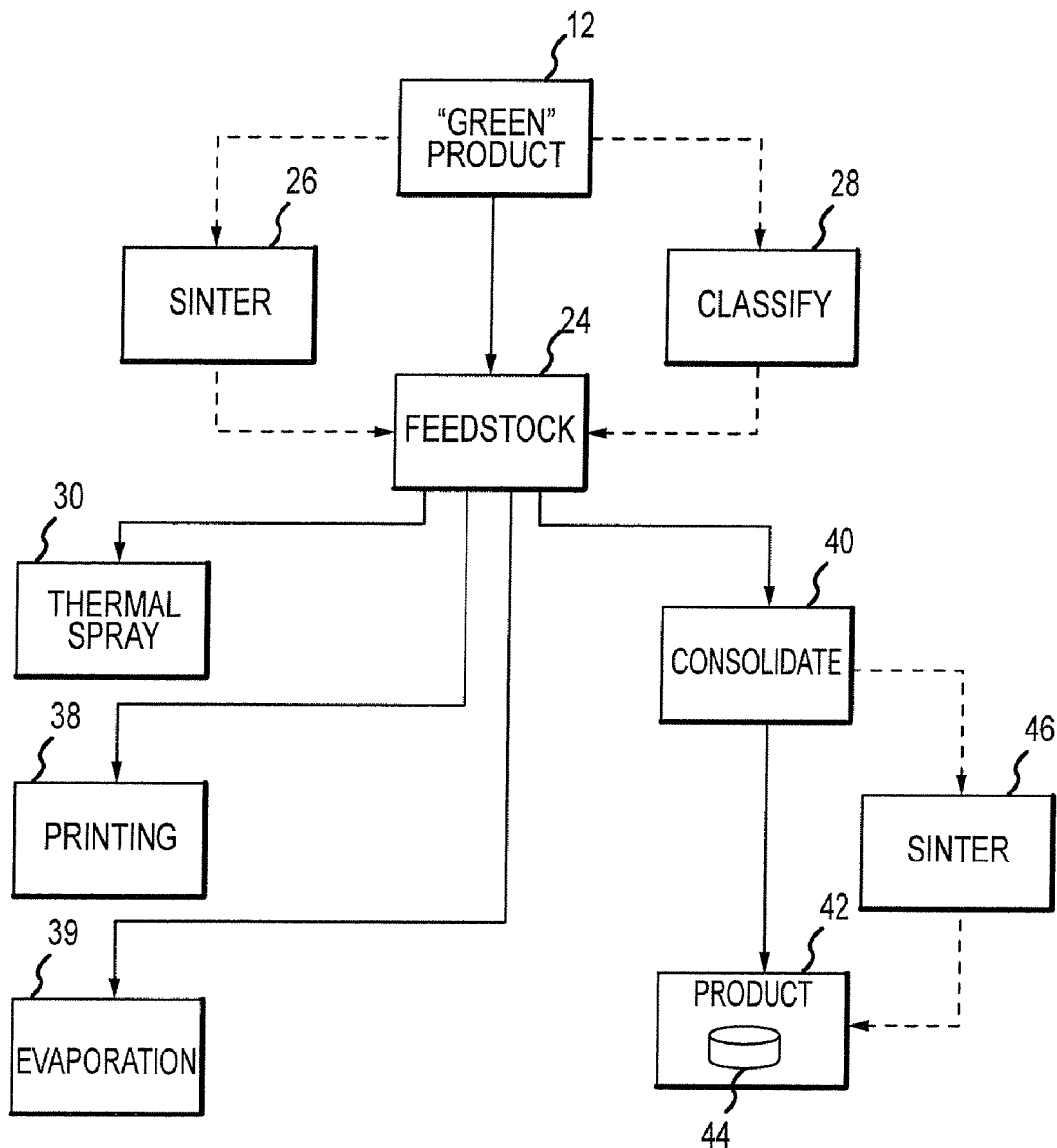
FIG. 2 is a process flow chart depicting methods for processing the composite metal powder mixture.
Figure 3:
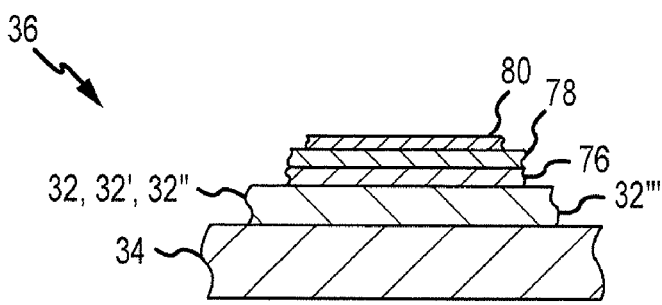
FIG. 3 is an enlarged cross-section in elevation of a photovoltaic cell having a sodium/molybdenum metal layer.

Referring now primarily to FIG. 2, the sodium/molybdenum composite metal powder 12 may be used in its as-recovered or "green" form as a feedstock 24 for a variety of processes and applications, many of which are shown and described herein, and others of which will become apparent to persons having ordinary skill in the art after having become familiar with the teachings provided herein. Alternatively, the "green" composite metal powder 12 may be further processed, e.g., by sintering 26, by classification 28, or combinations thereof, before being used as feedstock 24. The sodium/molybdenum composite metal powder feedstock 24 (e.g., in either the "green" form or in the processed form) may be used in a thermal spray deposition process 30 in order to deposit a sodium/molybdenum film 32 on a substrate 34, as best seen in FIG. 3. Such sodium/molybdenum films 32 may be used to advantage in a wide variety of applications. For example, and as will be described in further detail below, the sodium/molybdenum film 32 may comprise a portion of a photovoltaic cell 36 and may be used to improve the efficiency of the photovoltaic cell 36. In an alternate deposition process, the composite metal powder 12 may also be used as a feedstock 24 in a printing process 38 which may also be used to form a sodium/molybdenum film or coating 32' on substrate 34.

In still yet another embodiment, the composite metal powder feedstock 24, again in either its "green" form or in its processed form, may be consolidated at step 40 in order to produce a metal product 42, such as a sputter target 44. The metal product 42 may be used "as is" directly from consolidation 40. Alternatively, the consolidated product may be further processed, e.g., by sintering 46, in which case the metal product 42 will comprise a sintered metal product. In the case where the metal product 42 comprises a sputter target 44 (i.e., in either a sintered form or an un-sintered form), the sputter target 44 may be used in a sputter deposition apparatus (not shown) in order to deposit a sodium/molybdenum film 32" on substrate 34. See FIG. 3.

Figure 4:
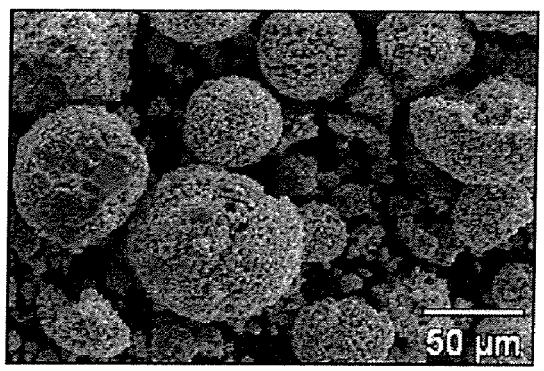
FIG. 4 is a scanning electron microscope image of a sodium/molybdenum composite metal powder mixture.
Figure 5A:
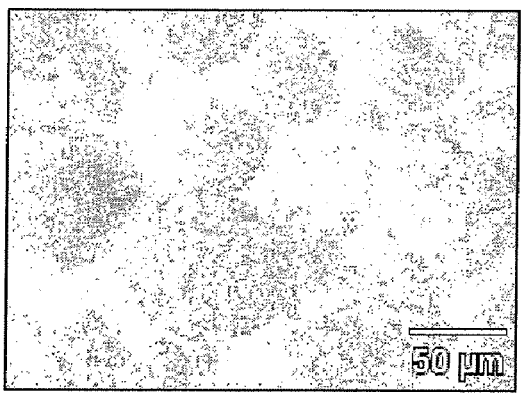
FIG. 5a is a spectral map produced by energy dispersive x-ray spectroscopy showing the dispersion of sodium in the image of FIG. 4.
Figure 5B:
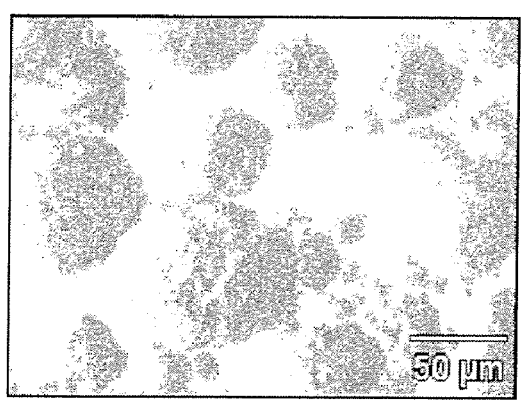
FIG. 5b is a spectral map produced by energy dispersive x-ray spectroscopy showing the dispersion of molybdenum in the image of FIG. 4.

Referring now primarily to FIGS. 4, 5a, and 5b, the sodium/molybdenum composite metal powder 12 comprises a plurality of generally spherically-shaped particles that are themselves agglomerations of smaller particles. Accordingly, the composite metal powder 12 may be characterized herein in the alternative as "soccer balls" formed of "BB's." Moreover, and as is evidenced by FIGS. 5a and 5b, the sodium is highly dispersed within the molybdenum. That is, the sodium/molybdenum composite powders of the present invention are not mere combinations of sodium metal powders and molybdenum metal powders, but rather comprise substantially homogeneous dispersions or composite mixtures of sodium and molybdenum sub-particles that are fused or agglomerated together. The sodium/molybdenum metal powder composite is also of high density and possesses favorable flow characteristics. As will be discussed in further detail herein, exemplary sodium/molybdenum composite metal powders 12 produced in accordance with the teachings provided herein may have Scott densities in a range of about 2 g/cc to about 3 g/cc. Hall flowabilities range from less than about 35 s/50 g to as low as 30 s/50 g for the various example compositions shown and described herein.

A significant advantage of the present invention is that it provides a combination of molybdenum and sodium that is otherwise difficult or impossible to achieve by conventional methods. Accordingly, the present invention provides a means for attaining a significantly higher concentration of sodium within a sodium/molybdenum powder and within a metal article produced from the powder that is difficult or impossible to achieve using ingot metallurgy processes. Moreover, even though the sodium/molybdenum composite metal powder comprises a powdered material, it is not a mere mixture of sodium and molybdenum particles. Instead, the sodium and molybdenum sub-particles are actually fused together, so that individual particles of the powdered metal product comprise both sodium and molybdenum. Accordingly, powdered feedstocks 24 comprising the sodium/molybdenum composite powders according to the present invention will not separate (e.g., due to specific gravity differences) into sodium particles and molybdenum particles. Furthermore, coatings or films produced from the sodium/molybdenum composite metal powders will have significantly higher amounts of sodium for increasing the efficiency of CIGS photovoltaic cells. The chemical compositions of the thin films may be similar to the compositions of the sodium/molybdenum metal powders since such deposition processes do not rely on the codeposition of separate molybdenum and sodium particles or codeposition of separate molybdenum and sodium-containing sputter targets, each of which would have different deposition rates.

Besides the advantages associated with the ability to provide a composite metal powder wherein sodium is highly and evenly dispersed throughout molybdenum, the composite metal powders disclosed herein are also characterized by high densities and flowabilities, thereby allowing the composite metal powders to be used to advantage in a wide variety of powder metallurgy processes that are now known in the art or that may be developed in the future. For example, the sodium molybdenum composite metal powders may be readily used in a wide variety of thermal spray deposition apparatus and associated processes to deposit sodium/molybdenum films or coatings on various substrates. The powders may also be readily used in a wide variety of consolidation processes, such as cold and hot isostatic pressing processes as well as pressing and sintering processes, hot axial pressing processes, and extrusion. The high flowability allows the powders disclosed herein to readily fill mold cavities, whereas the high density minimizes shrinkage that may occur during subsequent sintering. Sintering can be accomplished by heating in an inert atmosphere or in hydrogen to further reduce oxygen content of the compact.

In another embodiment, the sodium/molybdenum composite metal powders may be used to form sputter targets, which may then be used in subsequent sputter deposition processes to form sodium/molybdenum films and coatings. In one embodiment, such sodium/molybdenum films may used to increase the energy conversion efficiencies of photovoltaic cells.

Having briefly described the sodium/molybdenum composite metal powders 12 of the present invention, methods for producing them, and how they may be used to produce sodium/molybdenum coatings or films on substrates, various embodiments of the composite powders, as well as methods for producing and using the composite powders will now be described in detail.

Referring back now primarily to FIG. 1, a method 10 for producing sodium/molybdenum composite powders 12 may comprise a supply of molybdenum metal powder 14 and a supply of a sodium compound 16. The molybdenum metal powder 14 may comprise a molybdenum metal powder having a particle size in a range of about 0.1 μm to about 15 μm, although molybdenum metal powders 14 having other sizes may also be used. Molybdenum metal powders suitable for use in the present invention are commercially available from Climax Molybdenum, a Freeport-McMoRan Company, and from Climax Molybdenum Company, a Freeport-McMoRan Company, Ft. Madison Operations, Ft. Madison, Iowa (US). Alternatively, molybdenum metal powders from other sources may be used as well.

The sodium compound 16 may comprise sodium molybdate, either in its anhydrous form (i.e., $Na_2MoO_4$) or as the dihydrate (i.e., $Na_2MoO_4.2H_2O$), although other sodium-containing materials including, but not limited to elemental sodium, $Na_2O$, and $Na(OH)$, may be used. Sodium molybdate is usually available in powder form and may comprise any of a wide range of sizes. The particle size of the sodium molybdate powder 16 is not particularly critical in embodiments wherein water is used as the liquid 18, because sodium molybdate is soluble in water. Sodium molybdate powders suitable for use in the present invention are commercially available from Climax Molybdenum Company, a Freeport-McMoRan Company, Ft. Madison Operations, of Ft. Madison, Iowa (US). Alternatively, sodium molybdate may be obtained from other sources.

The molybdenum metal powder 14 and sodium molybdate 16 may be mixed with a liquid 18 to form a slurry 20. Generally speaking, the liquid 18 may comprise deionized water, although other liquids, such as alcohols, volatile liquids, organic liquids, and various mixtures thereof, may also be used, as would become apparent to persons having ordinary skill in the art after having become familiar with the teachings provided herein. Consequently, the present invention should not be regarded as limited to the particular liquids 18 described herein. In addition to the liquid 18, a binder 48 may be used as well, although the addition of a binder 48 is not required. Binders 48 suitable for use in the present invention include, but are not limited to, polyvinyl alcohol (PVA), Carbowax, and mixtures thereof. The binder 48 may be mixed with the liquid 18 before adding the molybdenum metal powder 14 and the sodium molybdate 16. Alternatively, the binder 48 could be added to the slurry 20, i.e., after the molybdenum metal 14 and sodium molybdate 16 have been combined with liquid 18.

The slurry 20 may comprise from about 15% to about 25% by weight liquid (e.g., either liquid 18 alone, or liquid 18 combined with binder 48), with the balance comprising the molybdenum metal powder 14 and the sodium compound 16. The sodium compound 16 (e.g., sodium molybdate) may be added in amounts suitable to provide the composite metal powder 12 and/or final product with the desired amount of "retained" sodium. Because the amount of retained sodium will vary depending on a wide range of factors, the present invention should not be regarded as limited to the provision of the sodium compound 16 in any particular amounts. Factors that may affect the amount of sodium compound 16 that is to be provided in slurry 20 include, but are not limited to, the particular product that is to be produced, the particular "downstream" processes that may be employed, e.g., depending on whether the sodium/molybdenum composite metal powder 12 is sintered, and on whether the desired quantity of retained sodium is to be in the powder feedstock (e.g., 24) or in a deposited film or coating (e.g., 32, 32', 32"). However, by way of example, the mixture of molybdenum metal 14 and sodium molybdate 16 may comprise from about 1% by weight to about 15% by weight sodium molybdate 18. Overall, then, slurry 20 may comprise from about 0% by weight (i.e., no binder) to about 2% by weight binder 48. The balance of slurry 20 may comprise molybdenum metal powder 14 (e.g., in amounts ranging from about 58% by weight to about 84% by weight) and sodium molybdate 16 (e.g., in amounts ranging from about 1% by weight to about 15% by weight).

Slurry 22 may then be spray dried by any of a wide range of processes that are now known in the art or that may be developed in the future in order to produce the composite metal powder product 12, as would become apparent to persons having ordinary skill in the art after having become familiar with the teachings provided herein. Consequently, the present invention should not be regarded as limited to any particular drying process. However, by way of example, in one embodiment, the slurry 20 is spray dried in a pulse combustion spray dryer 22. More specifically, pulse combustion spray dryer 22 may be of the type shown and described in U.S. Pat. No. 7,470,307, of Larink, Jr., entitled "Metal Powders and Methods for Producing the Same," which is specifically incorporated herein by reference for all that it discloses.

Figure 6:
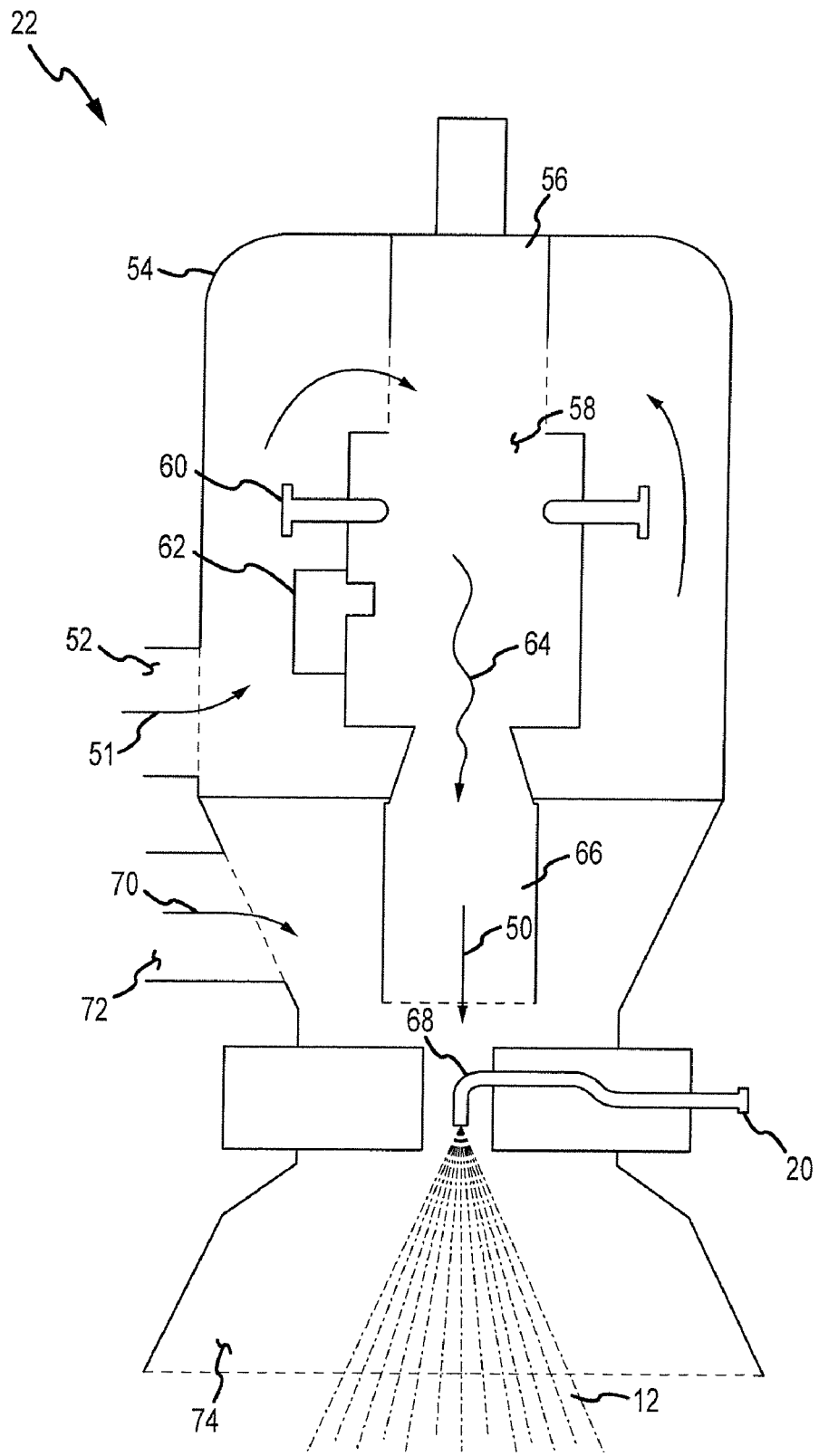
FIG. 6 is a schematic representation of one embodiment of pulse combustion spray dry apparatus.

Referring now to FIGS. 1 and 6, slurry 20 may be fed into pulse combustion spray dryer 22, whereupon slurry 20 impinges a stream of hot gas (or gases) 50, which are pulsed at or near sonic speeds. The sonic pulses of hot gas 50 contact the slurry 20 and drive-off substantially all of the water and form the composite metal powder product 12. The temperature of the pulsating stream of hot gas 50 may be in a range of about 300° C. to about 800° C., such as about 465° C. to about 537° C., and more preferably about 500° C. Generally speaking, the temperature of the pulsating stream of hot gas 50 is below the melting point of the slurry constituents, but not below the melting point of elemental sodium. However, the slurry 20 is usually not in contact with the hot gases 50 long enough to transfer a significant amount of heat to the slurry 20, which is significant because of the low melting point of sodium metal. For example, in a typical embodiment, it is estimated that the slurry 20 is generally heated to a temperature in the range of about 93° C. to about 121° C. during contact with the pulsating stream of hot gas 50.

As mentioned above, the pulsating stream of hot gas 50 may be produced by a pulse combustion system 22 of the type that is well-known in the art and readily commercially available. By way of example, in one embodiment, the pulse combustion system 22 may comprise a pulse combustion system of the type shown and described in U.S. Pat. No. 7,470,307. Referring now to FIG. 6, combustion air 51 may be fed (e.g., pumped) through an inlet 52 into the outer shell 54 of the pulse combustion system 22 at low pressure, whereupon it flows through a unidirectional air valve 56. The air then enters a tuned combustion chamber 58 where fuel is added via fuel valves or ports 60. The fuel-air mixture is then ignited by a pilot 62, creating a pulsating stream of hot combustion gases 64 which may be pressurized to a variety of pressures, e.g., in a range of about 15,000 Pa (about 2.2 psi) to about 20,000 Pa (about 3 psi) above the combustion fan pressure. The pulsating stream of hot combustion gases 64 rushes down tailpipe 66 toward the atomizer 68. Just above the atomizer 68, quench air 70 may be fed through an inlet 72 and may be blended with the hot combustion gases 64 in order to attain a pulsating stream of hot gases 50 having the desired temperature. The slurry 20 is introduced into the pulsating stream of hot gases 50 via the atomizer 68. The atomized slurry may then disperse in the conical outlet 74 and thereafter enter a conventional tall-form drying chamber (not shown). Further downstream, the composite metal powder product 12 may be recovered using standard collection equipment, such as cyclones and/or baghouses (also not shown).

In pulsed operation, the air valve 56 is cycled open and closed to alternately let air into the combustion chamber 58 and close for the combustion thereof. In such cycling, the air valve 56 may be reopened for a subsequent pulse just after the previous combustion episode. The reopening then allows a subsequent air charge (e.g., combustion air 51) to enter. The fuel valve 60 then re-admits fuel, and the mixture auto-ignites in the combustion chamber 58, as described above. This cycle of opening and closing the air valve 56 and combusting the fuel in the chamber 58 in a pulsing fashion may be controllable at various frequencies, e.g., from about 80 Hz to about 110 Hz, although other frequencies may also be used.

The "green" sodium/molybdenum composite metal powder product 12 produced by the pulse combustion spray drying process described herein is illustrated in FIGS. 4, 5a, and 5b, and comprises a plurality of generally spherically-shaped particles that are themselves agglomerations of smaller particles. As already described, the sodium is highly dispersed within the molybdenum, comprising a substantially homogeneous dispersion or composite mixture of sodium and molybdenum sub-particles that are fused together. More specifically, FIG. 5a is a spectral map produced by energy dispersive x-ray spectroscopy ("EDS") that illustrates the presence of sodium within the sample of the composite metal material 12 that is shown in FIG. 4. FIG. 5b is a spectral map produced by energy dispersive x-ray spectroscopy that shows the presence of molybdenum within the sample. As can be seen by comparing FIGS. 4 and 5a and 5b, the sodium is generally evenly and widely dispersed throughout the composite metal powder product 12.

Figure 7:
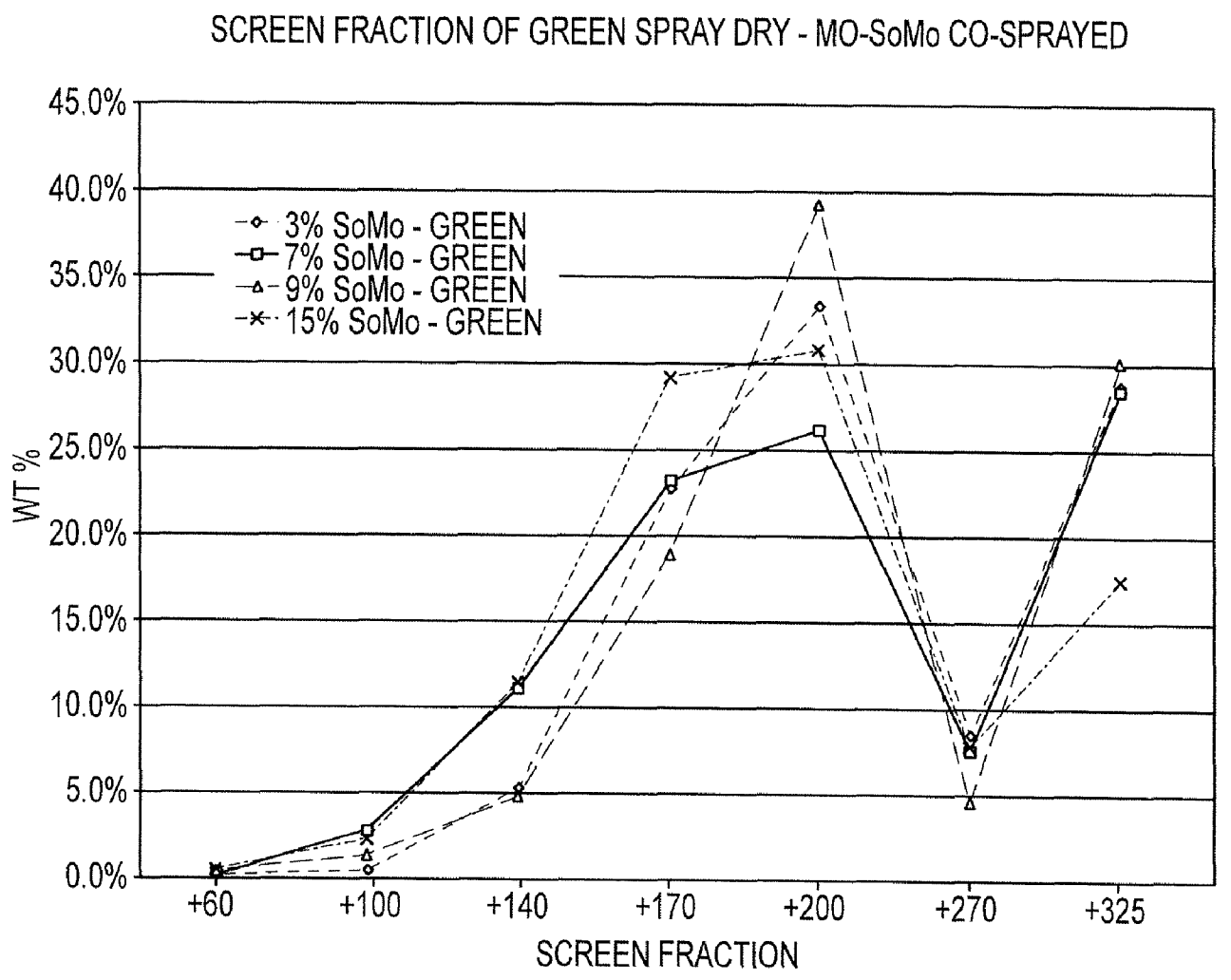

Generally speaking, the composite metal powder product 12 produced in accordance with the teachings provided herein will comprise a wide range of sizes, and particles having sizes ranging from about 1 μm to about 100 μm, such as, for example, sizes ranging from about 5 μm to about 45 μm and from about 45 μm to about 90 μm, can be readily produced by the following the teachings provided herein. The composite metal powder product 12 may be classified e.g., at step 28 (FIG. 2), if desired, to provide a product 12 having a more narrow size range. Sieve analyses of various exemplary composite metal powder products 12 are provided in FIG. 7, which is a plot of the particle size distributions (by Tyler mesh) of the "green" composite metal powder product 12 produced by slurry compositions comprising 3, 7, 9, and 15% by weight sodium molybdate 18.

As mentioned above, the sodium/molybdenum composite metal powder 12 is also of high density and is generally quite flowable. Exemplary composite metal powder products 12 have Scott densities (i.e., apparent densities) in a range of about 2 g/cc to about 3 g/cc, as identified in the various Examples set forth herein. Hall flowabilities range from about 35 s/50 g to as low as 30 s/50 g, again as identified in the various Examples set forth herein. One example composition (i.e., Example 12) had no flow, however.

As already described, the pulse combustion system 22 provides a pulsating stream of hot gases 50 into which is fed the slurry 20. The contact zone and contact time are very short, the time of contact often being on the order of a fraction of a microsecond. Thus, the physical interactions of hot gas 50, sonic waves, and slurry 20 produces the composite metal powder product 12. More specifically, the liquid component 18 of slurry 20 is substantially removed or driven away by the sonic (or near sonic) pulse waves of hot gas 50. The short contact time also ensures that the slurry components are minimally heated, e.g., to levels on the order of about 93° C. to about 121° C. at the end of the contact time, temperatures which are sufficient to evaporate the liquid component 18.

In certain instances, residual amounts of liquid (e.g., liquid 18 and/or binder 48, if used) may remain in the resulting "green" composite metal powder product 12. Any remaining liquid 18 may be driven-off (e.g., partially or entirely), by a subsequent sintering or heating step 26. See FIG. 2. Generally speaking, the heating or sintering process 26 is conducted at a moderate temperatures in order to drive off the liquid components and oxygen, but not substantial quantities of sodium. Some sodium may be lost during heating 26, which will reduce the amount of retained sodium in the sintered or feedstock product 24. It is also generally preferred, but not required, to conduct the heating 26 in a hydrogen atmosphere in order to minimize oxidation of the composite metal powder 12. Retained oxygen is low, less than about 6%, and generally less than about 2%, as indicated in the Examples provided below. Heating 26 may be conducted at temperatures within a range of about 500° C. to about 825° C. Alternatively, temperatures as high as 1050° C. may be used for short periods of time. However, such higher temperatures will usually reduce the amount of retained sodium in the final product.

It may also be noted that the agglomerations of the metal powder product preferably retain their shapes (in many cases, though not necessarily, substantially spherical), even after the heating step 26. Flowability data (Hall data) in heated and/or green forms are also generally very good (e.g., in a range of about 30-35 s/50 g), as described relative to the Examples provided herein.

As noted above, in some instances a variety of sizes of agglomerated products may be produced during the drying process, and it may be desirable to further separate or classify the composite metal powder product 12 into a metal powder product having a size range within a desired product size range. For example, most of the composite metal powder material produced will comprise particle sizes in a wide range (e.g., from about 1 μm to about 150 μm), with a substantial amount of product being in the range of about 5 μm to about 45 μm (i.e., −325 Tyler mesh) and again in the range of about 45 μm to 90 μm (i.e., −170+325 Tyler mesh). See FIG. 7. A process hereof may yield a substantial percentage of product in this product size range; however, there may be remainder products, particularly the smaller products, outside the desired product size range which may be recycled through the system, though liquid (e.g., water) would again have to be added to create an appropriate slurry composition. Such recycling is an optional alternative (or additional) step or steps.

The composite metal powder 12 may be used in its as-recovered or "green" form as a feedstock 24 for a variety of processes and applications, several of which are shown and described herein, and others of which will become apparent to persons having ordinary skill in the art after having become familiar with the teachings provided herein. Alternatively, the "green" composite metal powder product 12 may be further processed, such as, for example, by heating or sintering 26, by classification 28, and/or combinations thereof, before being used as feedstock 24.

As mentioned above, the sodium/molybdenum composite metal powder 12 may be used in various apparatus and processes to deposit sodium/molybdenum films on substrates. In one application, such sodium/molybdenum films can be used to advantage in the fabrication of photovoltaic cells. For example, it is known that the energy conversion efficiency of a CIGS photovoltaic cell can be increased if sodium is allowed to diffuse into the CIGS layer of the photovoltaic cell. Such efficiency gains are automatically realized in CIGS structures wherein the molybdenum back conductor is deposited on a soda-glass substrate. However, they are not realized in structures wherein soda-glass is not used as a substrate. Furthermore, additional efficiency gains may be realized by increasing the amount of sodium in the CIGS absorber layer beyond the levels typically attainable by the diffusion of sodium from soda lime glass. The sodium/molybdenum composite powder and films produced by the powder or deposited from metal articles produced by the powder provides a means for increasing the sodium content in the CIGS layer and to achieve efficiency gains.

Referring now to FIG. 3, a photovoltaic cell 36 may comprise a substrate 34 on which a sodium/molybdenum film 32, 32', 32" may be deposited. The substrate 34 may comprise any of a wide range of substrates such as, for example, glass, stainless steel, flexible poly films, or other substrate materials now known in the art or that may be developed in the future that are, or would be, suitable for such devices. A sodium/molybdenum film 32, 32', 32" may then be deposited on the substrate 34 by any of a wide range of processes now known in the art or that may be developed in the future, but utilizing in some form the sodium/molybdenum composite metal powder material 12. For example, and as will be described in further detail below, the sodium/molybdenum film may be deposited by thermal spray deposition, by printing, by evaporation, or by sputtering.

Once the sodium/molybdenum film (e.g., 32, 32', 32") is deposited on substrate 34, an absorber layer 76 may be deposited on the sodium/molybdenum film. By way of example, the absorber layer 76 may comprise one or more selected from the group consisting of copper, indium, gallium, and selenium. The absorber layer 76 may be deposited by any of a wide range of methods known in the art or that may be developed in the future that are, or would be, suitable for the intended application. Consequently, the present invention should not be regarded as limited to any particular deposition process. In addition, the present invention should not be regarded as limited to the fabrication of CIGS photovoltaic cells but could be applicable to any application containing molybdenum wherein the addition of significant amounts of sodium would be beneficial.

Next, a junction partner layer 78 may be deposited on the absorber layer 76. Junction partner layer 78 may comprise one or more selected from the group consisting of cadmium sulfide and zinc sulfide. Finally, a transparent conductive oxide layer 80 may be deposited on junction partner layer 78 to form the photovoltaic cell 36. Junction partner layer 78 and transparent conductive oxide layer 80 may be deposited by any of a wide range processes and methods now known in the art or that may be developed in the future that are, or would be, suitable for depositing these materials. Consequently, the present invention should not be regarded as limited to any particular deposition process. In addition, because processes for fabricating CIGS photovoltaic cells are known in the art (with the exception of providing the sodium/molybdenum film on the substrate) and could be readily implemented by persons having ordinary skill in the art after having become familiar with the teachings of the present invention, the particular fabrication techniques that may be utilized to construct a CIGS photovoltaic cell will not be described in further detail herein.

As mentioned above, the sodium/molybdenum layer or film 32, 32', 32" may be deposited by any of a wide range of processes. Generally speaking, it is believed that sodium concentrations of about 1% by weight or greater will be sufficient to provide the desired efficiency enhancements. Accordingly, the retained sodium present in the feedstock material 24 may be adjusted or varied as necessary in order to provide the desired level of sodium in the resulting sodium/molybdenum film 32. Generally speaking, retained sodium levels ranging from about 0.2% by weight to about 3.5% by weight in the feedstock material 24 will be sufficient to provide the desired degree of sodium enrichment in the sodium/molybdenum film 32. As indicated in the Examples, such retained sodium levels (e.g., from about 0.2 wt. % to about 3.5 wt. %) may be achieved in "green" and sintered (i.e., heated) feedstock material 24 produced by slurries 20 containing from about 3 wt. % to about 15 wt. % sodium molybdate.

In one embodiment, a sodium/molybdenum film 32 may be deposited by a thermal spray process 30 utilizing the feedstock material 24. Thermal spray process 30 may be accomplished by using any of a wide variety of thermal spray guns and operated in accordance with any of a wide range of parameters in order to deposit on substrate 34 a sodium/molybdenum film 32 having the desired thickness and properties. However, because thermal spray processes are well known in the art and because persons having ordinary skill in the art would be capable of utilizing such processes after having become familiar with the teachings provided herein, the particular thermal spray process 30 that may be utilized will not be described in further detail herein.

In another embodiment, a sodium/molybdenum film 32' may be deposited on substrate 34 by a printing process 38 utilizing the feedstock material 24. Feedstock material 24 may be mixed with a suitable vehicle (not shown) to form an "ink" or "paint" that may then be deposited on substrate 34 by any of a wide range of printing processes. Here again, because such printing processes are well known in the art and could be readily implemented by persons having ordinary skill in the art after having become familiar with the teachings provided herein, the particular printing process 38 that may be utilized will not be described in further detail herein.

In still another embodiment, a sodium/molybdenum film 32" may be deposited on substrate 34 by an evaporation process 39 utilizing the feedstock material 24. By way of example, in one embodiment, evaporation process 39 would involve placing the feedstock material 24 in a crucible (not shown) of a suitable evaporation apparatus (also not shown). The feedstock material 24 could be placed in the crucible either in the form of a loose powder, pressed pellets, or other consolidated forms, or in any combination thereof. The feedstock material 24 would the be heated in the crucible until it evaporates, whereupon the evaporated material would be deposited on substrate 34, forming the sodium/molybdenum film 32". Evaporation process 39 may utilize any of a wide range of evaporation apparatus now known in the art or that may be developed in the future that could be used to evaporate the feedstock material 24 and deposit film 32" on substrate 34. Consequently, the present invention should not be regarded as limited to use with any particular evaporation apparatus operated in accordance with any particular parameters. Moreover, because such evaporation apparatus are well known in the art and could be readily implemented by persons having ordinary skill in the art after having become familiar with the teachings provided herein, the particular evaporation apparatus that may be utilized will not be described in further detail herein.

In yet another embodiment, a sodium/molybdenum film 32''' may be deposited on substrate 34 by a sputter deposition process. The feedstock material 24 would be processed or formed into a sputter target 44, which would then be sputtered in order to form the film 32'''. Any of a wide range of sputter deposition apparatus that are now known in the art or that may be developed in the future could be used to sputter deposit film 32''' on substrate 34. Consequently, the present invention should not be regarded as limited to use with any particular sputter deposition apparatus operated in accordance with any particular parameters. Moreover, because such sputter deposition apparatus are well known in the art and could be readily implemented by persons having ordinary skill in the art after having become familiar with the teachings provided herein, the particular sputter deposition apparatus that may be utilized will not be described in further detail herein.

As mentioned, the sputter target 44 may comprise a metal product 42 that may be fabricated by consolidating or forming the sodium/molybdenum composite metal powder 12 at step 40. Alternatively, the sputter target 44 could be formed by thermal spraying 30. If the sputter target 44 is to be fabricated by consolidation 40, the feedstock material 24, in either its "green" form or processed form, may be consolidated or formed in step 40 to produce the metal product (e.g., sputter target 44). The consolidation process 40 may comprise any of a wide range of compaction, pressing, and forming processes now known in the art or that may be developed in the future that would be suitable for the particular application. Consequently, the present invention should not be regarded as limited to any particular consolidation process.

By way of example, the consolidation process 40 may comprise any of a wide range of cold isostatic pressing processes or any of a wide range of powder consolidation pressing processes that are well-known in the art including, but not limited to, hot pressing, hot isostatic pressing, and extrusion. As is known, both cold and hot isostatic pressing processes generally involve the application of considerable pressure and heat (in the case of hot isostatic pressing) in order to consolidate or form the composite metal powder feedstock material 24 into the desired shape. Hot isostatic pressing processes may be conducted at temperatures of 900° C. or greater, depending on the green density of the sodium/molybdenum composite metal powder compact and the retained sodium loss that could be tolerated in the final product.

After consolidation 40, the resulting metal product 42 (e.g., sputter target 44) may be used "as is" or may be further processed. For example, the metal product 42 may be heated or sintered at step 46 in order to alter the chemical composition of the metal product 42 and/or further increase the density of the metal product 42. It may be desirable to conduct such a heating process 46 in a hydrogen atmosphere in order to minimize the likelihood that the metal product 42 will become oxidized. Generally speaking, it will be preferred to conduct such heating at temperatures below about 825° C. as higher temperatures may result in substantial reductions in the amount of retained sodium, although higher temperatures (e.g., temperatures of 1050° C. or greater) could be used. The resulting metal product 42 may also be machined if necessary or desired before being placed in service. Such machining could be done regardless of whether the final product 42 was sintered.

Powder Examples

Several examples have been run using molybdenum metal and sodium molybdate powders 14, 16, specified herein and available from Climax Molybdenum and/or Climax Molybdenum, Ft. Madison Operations. Various ratios of the powders 14 and 16 were combined with deionized water to form the slurries 20. More specifically, the slurries 20 utilized for the various examples comprised about 20% by weight water (i.e., liquid 18), with the remainder being molybdenum metal and sodium molybdate powders. The ratio of molybdenum metal powder to sodium molybdate was varied in the various examples to range from about 3% by weight to about 15% by weight sodium molybdate. More specifically, the Examples involved amounts of 3, 7, 9, and 15 weight percent sodium molybdate.

The slurries 20 were then fed into the pulse combustion spray drying system 22 in the manner described herein. The temperature of the pulsating stream of hot gases 50 was controlled to be within a range of about 465° C. to about 537° C. The pulsating stream of hot gases 50 produced by the pulse combustion system 22 substantially drove-off the water from the slurry 20 to form the composite metal powder product 12. The contact zone and contact time were very short, the contact zone on the order of about 5.1 cm and the time of contact being on the order of 0.2 microseconds.

The resulting metal powder product 12 comprised agglomerations of smaller particles that were substantially solid (i.e., not hollow) and having generally spherical shapes. An SEM photo of a "green" sodium/molybdenum composite metal powder 12 produced by a slurry 20 comprising 9% by weight sodium molybdate is presented in FIG. 4. Data in Tables I and II are presented for the various examples in both "green" form, and after being sintered or heated in a hydrogen atmosphere at the temperatures and for the times specified. Data are also presented for screened green material (+325 mesh moly) as also indicated in Tables I and II.

TABLE I

| Example | Batch | Molybdenum metal (wt %) | Sodium Molybdate (SoMo) (wt %) | Apparent Density (g/cc) | Hall flow (s/50 g) |
|---|---|---|---|---|---|
| 1 | 3% SoMo Green | 97% | 3% | | |
| 2 | 7% SoMo Green | 93% | 7% | 2.89 | 33 |
| 3 | 9% SoMo Green | 91% | 9% | | |
| 4 | 15% SoMo Green | 85% | 15% | | |
| 5 | 3% SoMo + 325 mesh | 97% | 3% | | |
| 6 | 9% SoMo + 325 mesh | 91% | 9% | | |
| 7 | 15% SoMo + 325 mesh | 85% | 15% | | |
| 8 | 9% SoMo Sintered 1 h. 1050° C. | 91% | 9% | | |
| 9 | 7% SoMo Sintered 10 h. 640° C. | 93% | 7% | 2.79 | 32 |
| 10 | 9% SoMo Sintered 10 h. 640° C. | 91% | 9% | | |
| 11 | 3% SoMo Sintered 6 h. 825° C. | 97% | 3% | | |
| 12 | 9% SoMo Sintered 6 h. 825° C. | 91% | 9% | 2.62 | No Flow |
| 13 | 15% SoMo Sintered 6 h. 825° C. | 85% | 15% | | |

TABLE II

| Example | Slurry Viscosity Sec. Zahn#1 | Sodium Conc. (wt. %) | % O | % N | % Weight loss during Sintering | Na Distribution (EDS) |
|---|---|---|---|---|---|---|
| 1 | 33.8 | 0.74% | 1.23% | 0.0020% | | |
| 2 | | 1.39% | 2.14% | 0.2500% | | |
| 3 | 35 | 1.74% | 2.64% | 0.0075% | | Na varies in particles from 3% to 12% |
| 4 | | 3.11% | 5.58% | 0.0295% | | |
| 5 | | | 1.22% | 0.0016% | | |
| 6 | | 1.84% | 2.93% | 0.0101% | | No Na peak found by EDS |
| 7 | | 3.09% | 5.16% | 0.196% | | |
| 8 | | 0.73% | | | | No Na peak found by EDS |
| 9 | | 1.36% | 1.36% | 0.0000% | 0.97% | |
| 10 | | 1.85% | 1.85% | 0.0018% | 1.85% | 4% |
| 11 | | 0.22% | 0.22% | 0.0011% | 1.79% | |
| 12 | | 1.32% | 1.32% | 0.0010% | 3.90% | 1.86% |
| 13 | | 2.39% | 2.39% | 0.0015% | 4.84% | 2.89% |

As described above, the sodium/molybdenum composite metal powder 12 may be used to form or produce a variety of metal articles 42, such as a sputter target 44. The sputter target 44 may then be used to deposit a sodium-containing molybdenum film (e.g., film 32''') suitable for use in photovoltaic cells in the manner already described. Of course, the sputter targets 44 could be used to deposit sodium-containing molybdenum films in other applications as well.

Generally speaking, it is desirable that any such sputter targets 44 have a high a density (e.g., at least about 90% of theoretical density) to reduce or eliminate the presence of interconnected porosity in the target, to maximize target life, and to reduce the frequency of target change-out operations. In addition, such sputter targets 44 should have a sodium content of at least about 2.5% by weight and an oxygen content of less than about 6% by weight. It is also generally preferred that the sputter targets 44 be substantially chemically homogeneous with respect to sodium, oxygen, and molybdenum. That is, the quantities of sodium, oxygen, and molybdenum should not vary by more than about 20% throughout a target 44. It is also generally preferred that any such targets 44 be substantially physically homogeneous with respect to hardness. That is, the material hardness should not vary by more than about 20% over a given target 44.

Figure 8A:
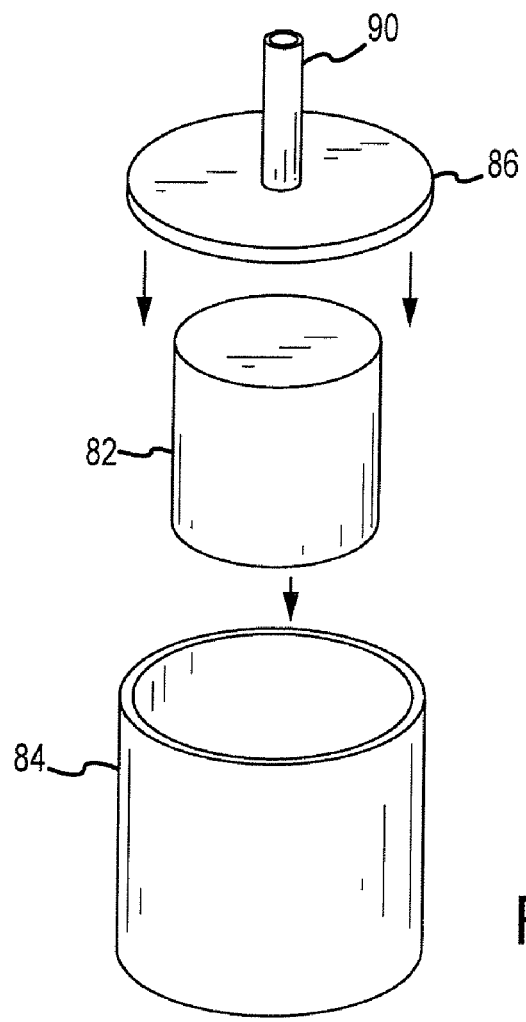
FIG. 8a is an exploded perspective view of a container and preformed metal article.
Figure 8B:
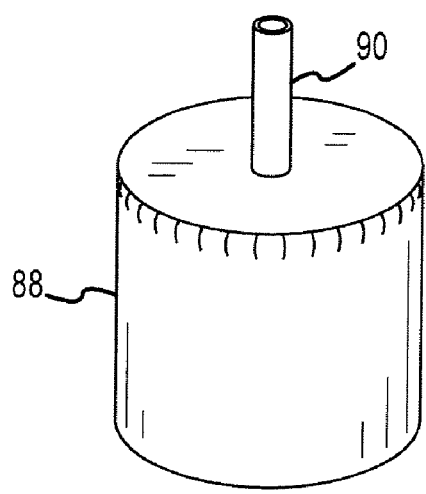
FIG. 8b is a perspective view of a sealed container containing the preformed metal article.

Referring now primarily to FIGS. 2, 8a, and 8b, a metal article 42 (FIG. 2), such as, for example, a sputter target 44 (FIGS. 2, 9, and 10), may be produced by compacting a quantity of sodium/molybdenum composite metal powder 12 (i.e., as a feedstock material 24) under sufficient pressure to form a preformed metal article 82. See FIG. 8a. The preformed metal article 82 may then be placed in a container or form 84 suitable for use in a hot isostatic press (not shown). The form 84 may then be sealed, such as, for example, by welding a lid or cap 86 on the form 84 to create a sealed container 88. See FIG. 8b. The cap 86 may be provided with a fluid conduit or tube 90 to allow the sealed container 88 to be evacuated to degas the preformed metal article 82 in the manner that will be described in greater detail below.

The sodium/molybdenum composite metal powder 12 (i.e., as a feedstock 24) used to form the preformed metal article 82 may be used in its as-recovered or "green" form from the pulse combustion spray dryer in the manner described above. Alternatively, and as already described above, the composite metal powder 12, may be further processed, such as, for example, by heating 26, by classification 28, and/or combinations thereof, before being used as the feedstock 24 for the preformed metal article 82.

In addition, and regardless of whether the powder 12 is heated (e.g., at step 26) or classified (e.g., at step 28), it will be generally preferable to first dry the "green" sodium/molybdenum composite metal powder product 12 by subjecting it to a low-temperature heating step. Such low-temperature drying of the green sodium/molybdenum composite metal powder product 12 will remove any residual moisture and/or volatile compounds that may remain in the powder 12 after the spray drying process. Low-temperature drying of the powder 12 may also provide the added benefit of increasing the flowability of the powder 12, which can be beneficial if the powder 12 is to be subsequently screened or classified. Of course, such a low-temperature drying process need not be performed if the powder 12 is to be heated in accordance with step 26 described above, because of the higher temperatures involved with heating step 26.

By way of example, in one embodiment, the low-temperature drying process may involve heating the sodium/molybdenum composite metal powder 12 in a dry atmosphere, such as dry air, to a temperature in a range of about 100° C. to about 200° C. and for a time between about 2 hours and 24 hours. Sodium/molybdenum composite metal powder lots subjected to this low-temperature drying process exhibited Hall flowabilities in a range of about 35 seconds to about 40 seconds per 50 grams.

In several of the example runs described herein, "green" sodium/molybdenum composite metal powder product 12 was used and subsequently screened or classified to result in the powder sizes specified herein for the various examples. However, the powder used to fabricate part 4 in Run 2 was first dried by subjecting it to the low-temperature drying process specified above (but not the higher temperature heating associated with step 26). The dried powder 12 was then screened or classified to result in the powder sizes specified for that example.

More specifically, the "green" powder 12 used to form the preformed metal article 82 in the Run 1 process was screened so that it contained particles smaller than about 105 μm (i.e., −150 Tyler mesh). With respect to the Run 2 process, the various preformed metal articles 82 (i.e., part numbers 1-3) were also made with "green" powder 12 screened so as to contain particles smaller than about 105 μm (i.e., −150 Tyler mesh). The preformed metal article 82 (i.e., part number 4) for the Run 2 process was made dried powder 12 that was screened so as to contain particles with sizes in a range of about 53 μm to about 300 μm (i.e., −50+270 Tyler mesh).

After having provided the feedstock material 24 (e.g., in either its "green" for or dried form) of a suitable and/or desired particle size range, the sodium/molybdenum composite metal powder 12 comprising feedstock 24 may then be then compacted to form preformed article 82. In the particular exemplary embodiments shown and described herein wherein the metal article 42 to be produced is to comprise a sputter target 44, the preformed article 82 may comprise a generally cylindrically shaped body, as best seen in FIG. 8*a*. After being fully consolidated in the manner described herein, the final metal article product 42 (i.e., the now-consolidated preformed cylinder) may then be cut into a plurality of disk-shaped sections or slices. The disk-shaped sections or slices may be subsequently machined to form one or more disk-shaped sputter targets 44. See FIGS. 2, 9, and 10. Alternatively, of course, metal articles having other shapes and configurations, and intended for other uses, could be produced in accordance with the teachings provided herein, as would become apparent to persons having ordinary skill in the art after having become familiar with the teachings provided herein. Consequently, the present invention should not be regarded as limited to metal articles having the particular shapes, configurations, and intended uses described herein.

In one embodiment, the preformed article 82 may be formed by a uniaxial compression process, wherein the feedstock material 24 (FIG. 2) is placed in a cylindrically-shaped die (not shown) and subjected to axial pressure in order to compress or compact the powdered feedstock material 24 so that it behaves as a nearly solid mass. Generally speaking, compaction pressures in a range of about 69 MPa (about 5 (short) tons per square inch (tsi)) to about 1,103 MPa (about 80 tsi) will provide sufficient compaction of the powdered feedstock material 24 so that the resulting preformed article 82 will be able to withstand subsequent handling and processing without disintegration. Alternatively, the sodium/molybdenum composite metal powder 12 may be compacted so as to result in the formation of preformed metal articles 82 having the densities specified in Table III:

TABLE III

| Cylinder Number | Green Density (g/cc) | Apparent Density (w/r to Mo) | Apparent Density (w/r to Rule of Mixtures) |
|---|---|---|---|
| 1 | 5.63 | 55.1% | 69.2% |
| 2 | 5.59 | 54.7% | 68.7% |
| 3 | 5.61 | 54.9% | 69.0% |
| 4 | 5.53 | 54.2% | 68.0% |
| 5 | 5.55 | 54.3% | 68.2% |
| 6 | 5.60 | 54.8% | 68.8% |
| 7 | 5.60 | 54.8% | 68.8% |
| 8 | 5.56 | 54.4% | 68.3% |
| 9 | 5.59 | 54.7% | 68.6% |
| 10 | 5.63 | 55.1% | 69.1% |
| 11 | 5.58 | 54.6% | 68.5% |
| 12 | 5.56 | 54.4% | 68.3% |
| 13 | 5.57 | 54.5% | 68.4% |
| 14 | 5.59 | 54.7% | 68.6% |
| 15 | 5.61 | 54.9% | 69.0% |
| 16 | 5.60 | 54.8% | 68.8% |

In an alternate embodiment, the preformed article 82 may be formed by a cold isostatic pressing process, wherein the feedstock material 24 (FIG. 2) is placed in a suitable mold or form (not shown) and subjected to "cold" isostatic pressure in order to compress or compact the powdered feedstock material 24 to form the preformed article 82. Generally speaking, isostatic pressures in a range of about 138 MPa (about 10 tsi) to about 414 MPa (about 30 tsi), will provide sufficient compaction.

After the preformed article 82 has been made (e.g., by uniaxial pressing or by cold isostatic pressing), it may be sealed within the container 84, heated, and subjected to isostatic pressure in the manner described herein. Optionally, however, the "green" preformed article 82 may be further dried by heating the preformed article 82 before sealing it within container 84. Such a heating process will serve to drive-off any moisture or volatile compounds that may be present in preformed article 82. Generally speaking, such heating could be conducted in a dry, inert atmosphere (e.g., argon), or simply in dry air. Alternatively, such heating could be conducted in a vacuum. By way of example, in one embodiment, the preformed article 82 may be heated in dry air at a temperature in a range of about 100° C. to about 200° C. (about 110° C. preferred) for a time in a range of about 8 hours to about 24 hours (about 16 hours preferred). Alternatively, the preformed article 82 can be heated until it displays no additional loss of weight.

The next step in the process or method for producing a metal article 42 (e.g., sputter target 44) involves placing the preformed article 82 in a container or form 84 suitable for use in a hot isostatic press (not shown). See FIG. 8*a*. In the embodiment shown and described herein, the container 84 comprises a generally hollow, cylindrically-shaped member that is sized to closely receive the substantially solid, cylindrically-shaped preformed article 82. Thereafter, form 84 can be sealed, for example, by welding a top or cap 86 thereto, in order to create a sealed container 88. See FIG. 8*b*. Cap 86 may be provided with a fluid conduit or tube 90 to allow the sealed container 88 to be evacuated.

The various components (e.g., 84, 86, and 90) comprising the sealed container 88 may comprise any of a wide range of materials suitable for the intended application. However, care should be exercised in selecting the particular material to avoid those materials that may introduce unwanted contaminants or impurities into the final metal article product 42 (e.g., sputter target 44). In embodiments utilizing the sodium/molybdenum powders 12 described herein as feedstock 24, the container material may comprise mild (i.e., low-carbon) steel or stainless steel. In either case, it may be beneficial to line the interior portions of the form 84 and cap 86 with a barrier material to inhibit diffusion of impurities from the form 84 and cap 86, particularly if they are fabricated from low-carbon steel. A suitable barrier material may comprise molybdenum foil (not shown), although other materials could be used.

After the preformed metal article 82 has been sealed within the container 88, it may optionally be degassed by connecting the tube 90 to a suitable vacuum pump (not shown) to evacuate the container 88 and remove any unwanted moisture or volatile compounds that may be contained within container 88 or metal article 82. The container 88 may be heated during the evacuation process to assist in the degassing procedure. While the amount of vacuum and temperature that may be applied during the degassing process is not particularly critical, by way of example, in one embodiment, sealed container 88 may be evacuated to a pressure in a range of about 1 millitorr to about 1,000 millitorr (about 750 millitorr preferred). It is generally preferred that the temperature be below the oxidation temperature of molybdenum (e.g., about 395-400° C.). By way of example, in one embodiment, the temperature may be in a range of about 100° C. to about 400° C. (about 250° C. preferred). The vacuum and temperature may be applied for a time period in a range of about 1 hour to about 4 hours (about 2 hours preferred). Once the degassing process is complete, the tube 90 may be crimped or otherwise sealed in order to prevent contaminants from re-entering the sealed container 88.

The preformed metal article 82 provided within sealed container 88 may then be further heated while also subjecting the sealed container 88 to isostatic pressure. Generally speaking, the container 88 should be heated to a temperature that is less than the optimal sintering temperature of the molybdenum powder component (such as, for example, a temperature less than about 1250° C.) while subjecting it to isostatic pressure for a time sufficient to increase the density of the preformed metal article 82 to at least about 90% of theoretical density. For example, isostatic pressures within a range of about 102 megapascals (MPa) (about 7.5 tsi) to about 205 MPa (about 15 tsi) and that are applied for a time period within a range of about 4 hours to about 8 hours will be sufficient to achieve density levels of at least about 90% of the theoretical density, and more preferably at least about 97% of the theoretical density.

After being heated and subjected to isostatic pressure, the final compacted article may be removed from the sealed container 88 and machined into final form. In the particular embodiments shown and described herein, the compacted article may be machined in accordance with techniques and procedures generally applicable to the machining of molybdenum metal. However, the use of water-based coolants and/or lubricants during machining should be avoided, as water will be absorbed by the sodium molybdate contained in the compacted article.

Figure 9:
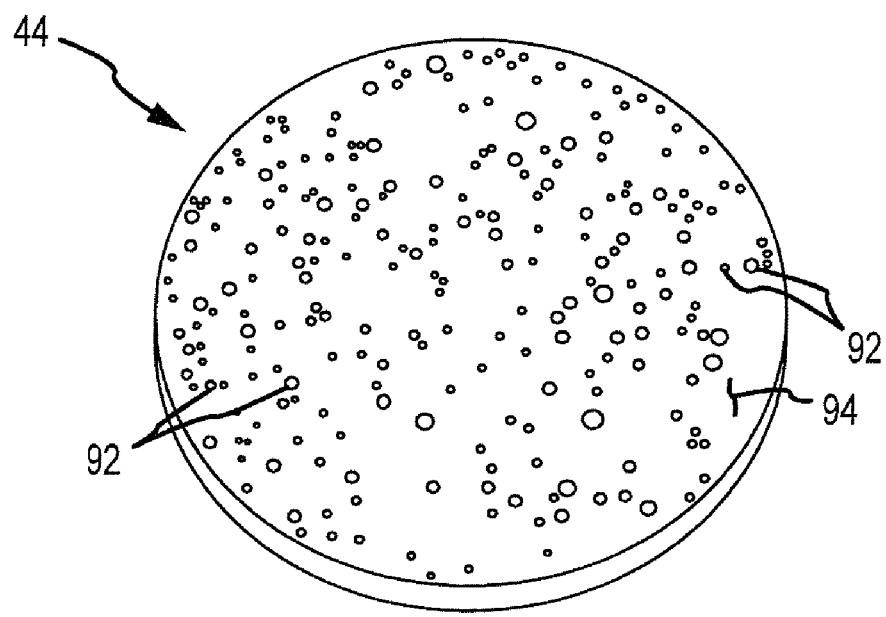
FIG. 9 is a pictorial representation of a metal article produced in accordance with the process of Run 1 showing a plurality of inhomogeneiaties contained therein.

Generally speaking, and particularly where the metal article 42 is to be used as a sputter target 44 for the purposes of depositing a sodium-containing molybdenum film for use in fabrication of photovoltaic cells, it will be preferable to subject the sealed container 88 to temperatures just below the melting temperature of the sodium-containing component (e.g., sodium molybdate) of the feedstock material 24, while also using higher isostatic pressures. For example, sputter targets 44 produced in accordance with the process of Run 1 (i.e., at a temperature of about 1250° C. and a pressure of about 102 MPa), were found to contain a plurality of inhomogeneities in the form of dark spots or discolored regions 92, as best seen in FIG. 9. The inhomogeneities 92 were present generally throughout the bulk of the material. Subsequent analysis revealed that the inhomogeneities 92 contained elevated levels of oxygen and carbon. For example, in the sample material produced by the Run 1 process, the dark spots or inhomogeneities contained about 4.1% by weight oxygen (as $O_2$) and about 507 parts per million by weight (ppm) carbon. This compares with oxygen levels of about 2.1% by weight and carbon levels of about 147 ppm in the non-spotted areas 94.

Figure 10:
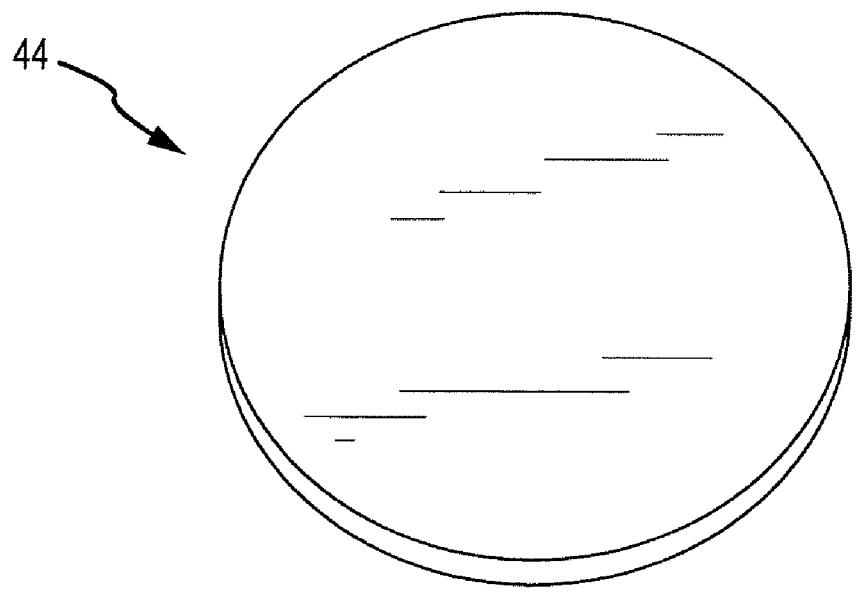
FIG. 10 is a pictorial representation of a metal article produced in accordance with the process of Run 2.

Surprisingly, the dark spots or inhomogeneities 92 can be significantly reduced or entirely eliminated by lowering the temperature and increasing the isostatic pressure. Significantly, this can be done without reducing the density of the resulting metal article 42. Indeed, as evidenced by the test data presented in Tables IV and VI, the densities of the metal articles 42 produced by the process of Run 2 are generally on a par with, and sometimes slightly greater than, the densities of the articles produced by the Run 1 process. The metal articles 42 (e.g., sputter targets 44) produced by the process of Run 2 did not exhibit any visually detectable dark spots or inhomogeneities, as best seen in FIG. 10.

Moreover, subsequent analysis indicates that the metal article sputter targets 44 produced by the Run 2 process are substantially chemically homogeneous with respect to sodium, oxygen, and molybdenum. In the particular example embodiments described herein, the sodium, oxygen, and molybdenum levels vary by less than about 13% throughout the material. The metal article sputter targets 44 are also substantially physically homogeneous with respect to hardness, with hardness variability (on the Rockwell hardness "A" scale) being generally less than about 10%.

Sodium concentrations of the metal article sputter targets 44 are generally greater than or equal to 2.5% by weight, as determined by inductively-coupled plasma emission spectroscopy (ICP), with oxygen levels being generally less than about 6% by weight (as determined by ICP). Also significantly (i.e., for sputter targets intended to produce sodium-containing molybdenum films for photovoltaic cell manufacture), iron levels are less than about 50 ppm, even with sodium levels of at least about 2.5% by weight. Purity of the sputter targets 44 exceeds about 99.9%, excluding gases (C, O, N, and H) and sodium, as determined by glow discharge mass spectroscopy (GDMS).

Metal Article Examples

A plurality of metal articles 42 (e.g., as sputter targets 44) were produced with the sodium/molybdenum composite metal powders 12 described herein. More specifically, metal articles 42 were produced using two different processes, designated "Run 1" and "Run 2." The Run 1 process involved subjecting a preformed metal article 82 disposed in a sealed container 88 to an isostatic pressure of about 102 MPa (about 7.5 tsi) and a temperature of about 1250° C. for a time period of about 8 hours. The temperature of 1250° C. is below the optimal sintering temperature of the molybdenum powder component of the sodium/molybdenum composite metal powder 12.

The Run 2 process involved subjecting several preformed metal articles 82 (i.e., parts 1-4) disposed in sealed containers 88 to an isostatic pressure of about 205 MPa (about 15 tsi) and a temperature of about 660° C. for a time period of about 4 hours. The temperature of 660° C. is below the melting point of the sodium-containing component (e.g., sodium molybdate) of the sodium/molybdenum composite metal powder 12.

As mentioned above, the metal articles 42 (e.g., sputter targets 44) produced by the Run 1 process displayed significant inhomogeneiaties 92 (e.g., in the form of dark spots) throughout the material, as best seen in FIG. 9. In contrast, the metal articles 42 (e.g., sputter targets 44) produced by the Run 2 process did not display any visually discernable inhomogeneiaties, as best seen in FIG. 10.

Run 1 Process

The preformed metal article 82 used for the Run 1 process was formed from a "green" sodium/molybdenum metal powder 12 produced in accordance with the teachings provided herein. The green sodium/molybdenum metal powder 12 was screened so that the particle size was less than about 105 μm (−150 Tyler mesh). The screened powder was then cold pressed under a uniaxial pressure in a range of about 225 MPa (about 16.5 tsi) to about 275 MPa (about 20 tsi) to yield a preformed cylinder or article 82. The preformed cylinder 82 was then placed in a container 84 of low-carbon steel and sealed in the manner described herein.

After being placed within sealed container 88 (FIG. 8*b*), the preformed cylinder 82 was degassed by heating it to a temperature of about 400° C. under a dynamic vacuum (e.g., about 750 millitorr) in the manner already described. The degassed sealed container 88 was then subjected to a isostatic pressure of about 102 MPa (i.e., 7.375 tsi) for a time of about 8 hours and at a temperature of about 1250° C. The resulting compacted metal product (e.g., product 42) was then sliced into six disk-shaped articles, each of which was subsequently machined to form the final sputter target product 44. Disk number 1 was taken from near the top of the compacted cylinder, with subsequent disk numbers 2-6 descending down the compacted cylinder. A representative machined disk (i.e., sputter target 44) is depicted in FIG. 9.

As can be seen with reference to FIG. 9, the sputter target 44 made from the cylinder produced in accordance with the Run 1 process contains a plurality of inhomogeneities 92, which appear as dark regions or spots. The inhomogeneities 92 are present generally throughout the bulk of the material. Subsequent analysis revealed that the inhomogeneities 92 contained elevated levels of oxygen and carbon. In addition, laser ablation ICP (inductively coupled plasma emission spectroscopy) of the dark spots or inhomogeneities 92 indicated lower levels of tungsten and potassium compared to those contained in the lighter areas 94. Data from disks 1-6 are presented in Tables IV and V.

More specifically, Table IV presents the densities of the disks in units of grams per cubic centimeter (g/cc). The densities presented in Table IV were determined by measuring the dimensions of the machined disks to calculate the disk volume. The measured mass of each machined disk was then divided by its measured volume to arrive at the density. Apparent density, expressed as a percentage of theoretical density, is also presented. Table IV also presents the hardness of both the dark spots 92 and the light areas 94, as expressed on the Rockwell Hardness "A" scale (HRA), at a distance of about 15 millimeters (mm) from the outside diameter of the disk.

TABLE IV

| Disk No. | Density (g/cc) | Apparent Density (%) | HRA of Light Area | HRA of Dark Spot |
|---|---|---|---|---|
| 1 | — | — | — | — |
| 2 | — | — | 41 | 39 |
| 3 | 7.82 | 96.1% | — | — |
| 4 | 7.90 | 97.0% | 43.5 | 31 |
| 5 | 8.01 | 98.4% | — | — |
| 6 | 8.03 | 98.7% | 41.5 | 34 |

Table V presents various chemical properties of the machined disks (i.e., sputter targets 44) produced by the process of Run 1. More specifically, the chemical properties of disks 1, 3, and 5 were determined at various outer, middle, and inner positions of the disks, specifically at positions of about 5 millimeters (mm), about 15 mm, and about 25 mm from the outside diameter of the disks, respectively. The sodium content at each position was determined by both atomic absorption (AA) and by ICP analytical techniques. Iron, manganese, tungsten, and copper amounts are expressed in units of parts per million by weight (ppm), as determined by glow discharge mass spectroscopy (GDMS).

TABLE V

| Disk No. | Location | Na (AA) (wt. %) | Na (ICP) (wt. %) | Fe (ppm) | Mn (ppm) | W (ppm) | Cu (ppm) |
|---|---|---|---|---|---|---|---|
| 1 | inner | 4.00 | 3.24 | 17000 | 90 | 140 | 22 |
|   | middle | 4.19 | 3.37 | 22000 | 89 | 150 | 22 |
|   | outer | 4.20 | 3.43 | 29000 | 110 | 140 | 25 |
| 3 | inner | 3.78 | 3.00 | 2600 | — | — | — |
|   | middle | 3.78 | 2.91 | 950 | 13 | 110 | 7.5 |
|   | outer | 3.77 | 2.96 | 880 | 12 | 130 | 7.9 |
| 5 | inner | 3.59 | 2.97 | — | — | — | — |
|   | middle | 3.77 | 2.94 | — | — | — | — |
|   | outer | 3.60 | 2.91 | — | — | — | — |

Run 2 Process

Four (i.e., part numbers 1-4) preformed metal articles 82 were used for the Run 2 Process. More specifically, preformed metal article part numbers 1-3 were made with "green" sodium/molybdenum composite metal powder 12 screened so that the particle size was less than about 105 μm (−150 Tyler mesh). The preformed metal article part number 4 was made with a dried sodium/molybdenum composite metal powder 12 that was then screened to result in a particle mixture having particles in a size range of about 53 μm to about 300 μm (−50+270 Tyler mesh).

The sealed container 88 containing preformed metal article part 1 was fabricated from stainless steel. The sealed container containing part 2 was fabricated from low-carbon steel and lined with molybdenum foil. The sealed containers containing parts 3 and 4 were fabricated from low-carbon steel and were un-lined.

The various powders used to fabricate the preformed metal articles 82 (i.e., corresponding to part numbers 1-4) were cold pressed under a uniaxial pressure in a range of about 225 MPa (about 16.5 tsi) to about 275 MPa (about 20 tsi) to yield preformed cylinders (e.g., preformed metal articles 82) having the densities provided in Table III presented above. Specifically, cylinders 2, 5, 9, and 13 identified in Table III were used in the Run 2 process.

Before being placed into the various containers 84 (e.g., fabricated from stainless steel or low-carbon steel and lined or un-lined with molybdenum foil, as specified), the preformed cylinders 82 were heated to a temperature of about 110° C. in a dry air atmosphere for a period of about 16 hours in order to remove residual amounts of moisture and/or volatile components that may have been contained in the preformed cylinders 82. The dried cylinders 82 were then placed in their respective containers and sealed in the manner described herein. The sealed containers 88 were then degassed in the manner described herein by heating the sealed containers to a temperature of about 400° C. while subjecting them to a dynamic vacuum (about 750 millitorr). The degassed, sealed containers 88 were then subjected to a isostatic pressure of about 205 MPa (i.e., 14.875 tsi) for a time of about 4 hours and at a temperature of about 660° C.

The resulting compacted metal cylinders (i.e., parts 1-4) were then removed from the sealed containers 88. However, it was not possible to separate part 3 from its sealed container. The compacted metal cylinders that were successfully separated from their respective containers 88 (e.g., parts 1, 2, and 4) where then sliced to form a plurality of disk-shaped articles. Disk number 1 was taken from near the top of the compacted cylinder, with subsequent disks descending down the cylinder with increasing disk number. The disks were then machined to form the final sputter targets 44. A representative disk (i.e., sputter target 44) from part number 2 (produced in the low-carbon steel can lined with molybdenum foil) is depicted in FIG. 10. Significantly, none of the articles 42 (e.g., sputter target disks 44) produced in accordance with the process of Run 2 displayed the inhomogeneities associated with the articles produced by the process of Run 1 and illustrated in FIG. 9.

Table VI presents the densities (in units of g/cc) of disks made from the various part numbers 1, 2, and 4. The densities presented in Table VI were determined by measuring the dimensions of the machined disks to calculate the disk volume. The measured mass of each machined disk was then divided by its measured volume to arrive at the density. Apparent density, expressed as a percentage of theoretical density, is also presented. Table VI also presents the hardness of the disks expressed on the Rockwell Hardness "A" scale (HRA) at a distance of about 13 millimeters (mm) from the outside diameter of the disk.

TABLE VI

| Part No. | Disk No. | Density (g/cc) | Apparent Density (%) | HRA |
|---|---|---|---|---|
| 1 | 1 | 7.96 | 97.8% | 40 |
|   | 2 | — | — | — |
|   | 3 | 8.07 | 99.2% | — |
|   | 4 | 8.07 | 99.1% | 39.5 |
| 2 | 1 | 8.10 | 99.5% | 43.5 |
|   | 2 | 8.07 | 99.1% | — |
|   | 3 | 8.06 | 99.1% | — |
|   | 4 | 8.09 | 99.4% | 41 |
| 4 | 1 | 7.95 | 97.6% | 42 |
|   | 2 | 7.94 | 97.5% | 36 |

Table VII presents various chemical properties of certain disks taken from parts 1, 2, and 4 produced by the process of Run 2. More specifically, Table VII lists the chemical properties of the disks taken from top and middle portions of the compacted cylinders and are identified in Table VII as disks "T" (for top) and disks "M" (for middle), respectively. The chemical properties for the top "T" and middle "M" disks were measured at two positions on each disk, an outer position "O" and a center position "C". The outer position "O" was located at a position in a range of about 5 mm to about 10 mm from the outside diameter of the disk, whereas the center position "C" was located at a position in a range of about 25 mm to about 35 mm from the outside diameter of the disk. The sodium and oxygen content at each position was determined by the ICP analytical technique and are presented in terms of weight percent. Iron, tungsten, silicon, chromium, cobalt, and nickel amounts are presented in units of parts per million by weight (ppm) as determined by glow discharge mass spectroscopy (GDMS).

Still other variations are possible for producing metal articles with the sodium/molybdenum composite metal powders described herein. For example, in another embodiment, a closed die can be filled with a supply of sodium/molybdenum composite metal powder. The powder may then be axially compressed at a temperature and pressure sufficient to increase the density of the resulting metal article to at least about 90% of theoretical density. Still yet another variation may involve providing a supply of the sodium/molybdenum composite metal powder and compacting the powder to form a preformed metal article. The article may then be placed in a sealed container and heated to a temperature that is lower than the melting point of sodium molybdate. The sealed container may then be extruded at a reduction ratio sufficient to increase the density of the article to at least about 90% of theoretical density.

Having herein set forth preferred embodiments of the present invention, it is anticipated that suitable modifications can be made thereto which will nonetheless remain within the scope of the invention. The invention shall therefore only be construed in accordance with the following claims:

The invention claimed is:

1. A method for producing a metal article, comprising:
providing a supply of a sodium/molybdenum composite metal powder, the sodium/molybdenum composite metal powder comprising a substantially homogeneous dispersion of sodium and molybdenum sub-particles that are fused together to form individual particles, said sodium/molybdenum composite metal powder comprising at least about 85% by weight molybdenum;
compacting the sodium/molybdenum composite metal powder under sufficient pressure to form a preformed article;
placing the preformed article in a sealed container;
raising the temperature of the sealed container to a temperature that in a range of about 660° C. to about 1250° C.; and
subjecting the sealed container to an isostatic pressure for a time sufficient to increase the density of the article to at least about 90% of theoretical density.

2. The method of claim 1, wherein raising the temperature of the sealed container comprises raising the temperature of the sealed container to a temperature in a range of about 660° C. to about 800° C.

3. The method of claim 1, wherein raising the temperature of the sealed container comprises raising the temperature of the sealed container to a temperature of about 660° C.

4. The method of claim 1, wherein subjecting the sealed container to an isostatic pressure comprises subjecting the sealed container to an isostatic pressure in a range of about 102 MPa to about 205 MPa.

TABLE VII

| Part No. | Disk/Position | Na (wt. %) | $O_2$ (wt. %) | Fe (ppm) | W (ppm) | Si (ppm) | Cr (ppm) | Co (ppm) | Ni (ppm) |
|---|---|---|---|---|---|---|---|---|---|
| 1 | T/O | 3.4 | 4.79 | 25 | 190 | 5.3 | 22 | 5.8 | 8.8 |
|   | T/C | 3.37 | 4.95 | 38 | 200 | 5.9 | 38 | 3.8 | 8.3 |
|   | M/C | 3.0 | 5.01 | 21 | 200 | 6.8 | 38 | 1.6 | 6.0 |
| 2 | T/O | 3.1 | 5.13 | 33 | 210 | 6.5 | 27 | 6.3 | 7.8 |
|   | T/C | 3.16 | 4.83 | 26 | 240 | 8.2 | 39 | 8.9 | 7.7 |
|   | M/C | 3.13 | 4.86 | 29 | 190 | 3.7 | 35 | 1.7 | 6.3 |
| 4 | T/O | 3.46 | 5.76 | 24 | 170 | 12 | 34 | 2.3 | 8.2 |
|   | T/C | 3.6 | 5.24 | 28 | 240 | 9.5 | 21 | 5.5 | 6.3 |
|   | M/C | 3.51 | 5.5 | 27 | 160 | 9.4 | 22 | 1.9 | 8.8 |

5. The method of claim 1, wherein subjecting the sealed container to an isostatic pressure comprises subjecting the sealed container to an isostatic pressure of about 205 MPa.

6. The method of claim 1, wherein subjecting the sealed container to a hot isostatic pressing process is conducted for a time in a range of about 4 hours to about 8 hours.

7. The method of claim 1, wherein subjecting the sealed container to a hot isostatic pressing process is conducted for a time of about 4 hours.

8. The method of claim 1, wherein said compacting comprises subjecting the sodium/molybdenum composite metal powder to a uniaxial pressure in a range of about 67 MPa to about 1,103 MPa to form the preformed article.

9. The method of claim 1, wherein said compacting comprises subjecting the sodium/molybdenum composite metal powder to a cold isostatic pressure in a range of about 138 MPa to about 414 MPa to form the preformed article.

10. The method of claim 1, further comprising degassing the preformed article before said subjecting the sealed container to an isostatic pressure by evacuating the sealed container while heating the sealed container.

11. The method of claim 10, wherein said degassing comprises evacuating the sealed container to a pressure of about 750 millitorr.

12. The method of claim 10, wherein said degassing comprises heating the sealed container to a temperature below an oxidation temperature of molybdenum.

13. The method of claim 10, wherein said degassing comprises heating the sealed container to a temperature in a range of about 100° C. to about 400° C.

14. The method of claim 10, wherein said degassing comprises heating the sealed container to a temperature of about 250° C. for a time of about 2 hours.

15. The method of claim 1, wherein said subjecting the sealed container to an isostatic pressure comprises subjecting the sealed container to an isostatic pressure for a time sufficient to increase the density of the article to at least about 97% of theoretical density.

16. The method of claim 1, further comprising drying the preformed article before placing the preformed article in a sealed container by heating the preformed article to a temperature in a range of about 100° C. to about 200° C.

17. The method of claim 16, wherein said drying the preformed article comprises heating the preformed article to a temperature of about 110° C. for a time of about 16 hours.

18. The method of claim 1, further comprising drying said supply of sodium/molybdenum composite metal powder before said compacting by heating said supply of sodium/molybdenum composite metal powder to a temperature in a range of about 100° C. to about 200° C.

19. The method of claim 18, wherein said drying said supply of sodium/molybdenum composite metal powder comprises heating said supply of sodium/molybdenum composite metal powder to a temperature of about 110° C. for a time in a range of about 2 hours to about 24 hours.

20. The method of claim 1, wherein said raising the temperature of the sealed container to a temperature in a range of about 660 to about 1250 comprises raising the temperature of the sealed container to a temperature below a spot temperature, the spot temperature being a temperature above which said metal article will include localized inhomogeneities having elevated levels of oxygen and carbon.

21. A method for producing a metal article, comprising:
providing a supply of a sodium/molybdenum composite metal powder, the sodium/molybdenum composite metal powder comprising a substantially homogeneous dispersion of sodium and molybdenum sub-particles that are fused together to form individual particles, said sodium/molybdenum composite metal powder comprising at least about 85% by weight molybdenum;
compacting the sodium/molybdenum composite metal powder under sufficient pressure to form a preformed article;
placing the preformed article in a sealed container;
raising the temperature of the sealed container to a temperature that is lower than a spot temperature, the spot temperature being a temperature above which said metal article will include localized inhomogeneities having elevated levels of oxygen and carbon; and
subjecting the sealed container to an isostatic pressure for a time sufficient to increase the density of the article to at least about 90% of theoretical density.

22. The method of claim 21, wherein said spot temperature is less than 1250° C.

23. The method of claim 22, wherein said spot temperature is greater than 660° C.

* * * * *

UNITED STATES PATENT AND TRADEMARK OFFICE
CERTIFICATE OF CORRECTION

| | | |
|---|---|---|
| PATENT NO. | : 8,197,885 B2 | Page 1 of 1 |
| APPLICATION NO. | : 12/392792 | |
| DATED | : June 12, 2012 | |
| INVENTOR(S) | : Dave Honecker et al. | |

It is certified that error appears in the above-identified patent and that said Letters Patent is hereby corrected as shown below:

Title Page (54): Title, Delete "Power" and insert --Powder--.

Signed and Sealed this
Fourteenth Day of August, 2012

David J. Kappos
*Director of the United States Patent and Trademark Office*

UNITED STATES PATENT AND TRADEMARK OFFICE
CERTIFICATE OF CORRECTION

PATENT NO. : 8,197,885 B2  
APPLICATION NO. : 12/392792  
DATED : June 12, 2012  
INVENTOR(S) : Dave Honecker et al.

Page 1 of 1

It is certified that error appears in the above-identified patent and that said Letters Patent is hereby corrected as shown below:

Title Page (54) and at Column 1, line 2, Title, Delete "Power" and insert --Powder--.

This certificate supersedes the Certificate of Correction issued August 14, 2012.

Signed and Sealed this  
Fourth Day of September, 2012

David J. Kappos  
*Director of the United States Patent and Trademark Office*